US010128163B2

(12) United States Patent
Tamagawa et al.

(10) Patent No.: US 10,128,163 B2
(45) Date of Patent: Nov. 13, 2018

(54) CHIP PART AND METHOD FOR MANUFACTURING A CHIP PART

(71) Applicant: ROHM CO., LTD., Kyoto (JP)

(72) Inventors: Hiroshi Tamagawa, Kyoto (JP); Yasuhiro Kondo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/383,336

(22) Filed: Dec. 19, 2016

(65) Prior Publication Data
US 2017/0236765 A1 Aug. 17, 2017

(30) Foreign Application Priority Data

Feb. 17, 2016 (JP) .................. 2016-028289

(51) Int. Cl.
H01L 29/06 (2006.01)
H01L 23/31 (2006.01)
H01L 21/3065 (2006.01)
H01L 21/56 (2006.01)
H01L 21/78 (2006.01)
(Continued)

(52) U.S. Cl.
CPC .... *H01L 23/3178* (2013.01); *H01L 21/30655* (2013.01); *H01L 21/56* (2013.01); *H01L 21/78* (2013.01); *H01L 23/3185* (2013.01); *H01L 23/3192* (2013.01); *H01L 24/05* (2013.01); *H01L 24/13* (2013.01); *H01L 29/34* (2013.01); H01L 23/562 (2013.01); *H01L 2224/02206* (2013.01); *H01L 2224/02215* (2013.01); *H01L 2224/0401* (2013.01); *H01L 2224/05124* (2013.01); *H01L 2224/05147* (2013.01); *H01L 2224/13026* (2013.01); *H01L 2224/13083* (2013.01); *H01L 2224/13144* (2013.01); *H01L 2224/13155* (2013.01); *H01L 2224/13164* (2013.01); *H01L 2924/05042* (2013.01); *H01L 2924/05442* (2013.01); *H01L 2924/07025* (2013.01)

(58) Field of Classification Search
CPC ... H01L 21/30655; H01L 21/56; H01L 21/78; H01L 23/3192; H01L 21/3178
USPC .......................................................... 257/622
See application file for complete search history.

(56) References Cited

U.S. PATENT DOCUMENTS 7,132,665 B2 * 11/2006 Sato ...................... G01T 1/2002
                                                             250/368
9,337,225 B2 * 5/2016 Hsu .................... H01L 27/14623
9,608,060 B2 * 3/2017 Chou ................. H01L 21/76224

FOREIGN PATENT DOCUMENTS

JP          2011-216821 A       10/2011

* cited by examiner

Primary Examiner — Tan N Tran
(74) Attorney, Agent, or Firm — Rabin & Berdo, P.C.

(57) ABSTRACT

A chip part includes a substrate that has an upper surface, a lower surface positioned on an opposite side of the upper surface, and a sidewall by which the upper surface and the lower surface are connected together and that has a plurality of concavo-convex portions formed on the sidewall from a side of the upper surface toward a side of the lower surface, a functional element formed at the side of the upper surface of the substrate, a first external electrode and a second external electrode that are arranged at the upper surface of the substrate so as to be electrically connected to the functional element, and a sidewall insulating film with which the sidewall of the substrate is coated so as to fill the plurality of concavo-convex portions formed on the sidewall of the substrate with the sidewall insulating film.

17 Claims, 36 Drawing Sheets

(51) Int. Cl.
*H01L 23/00* (2006.01)
*H01L 29/34* (2006.01)

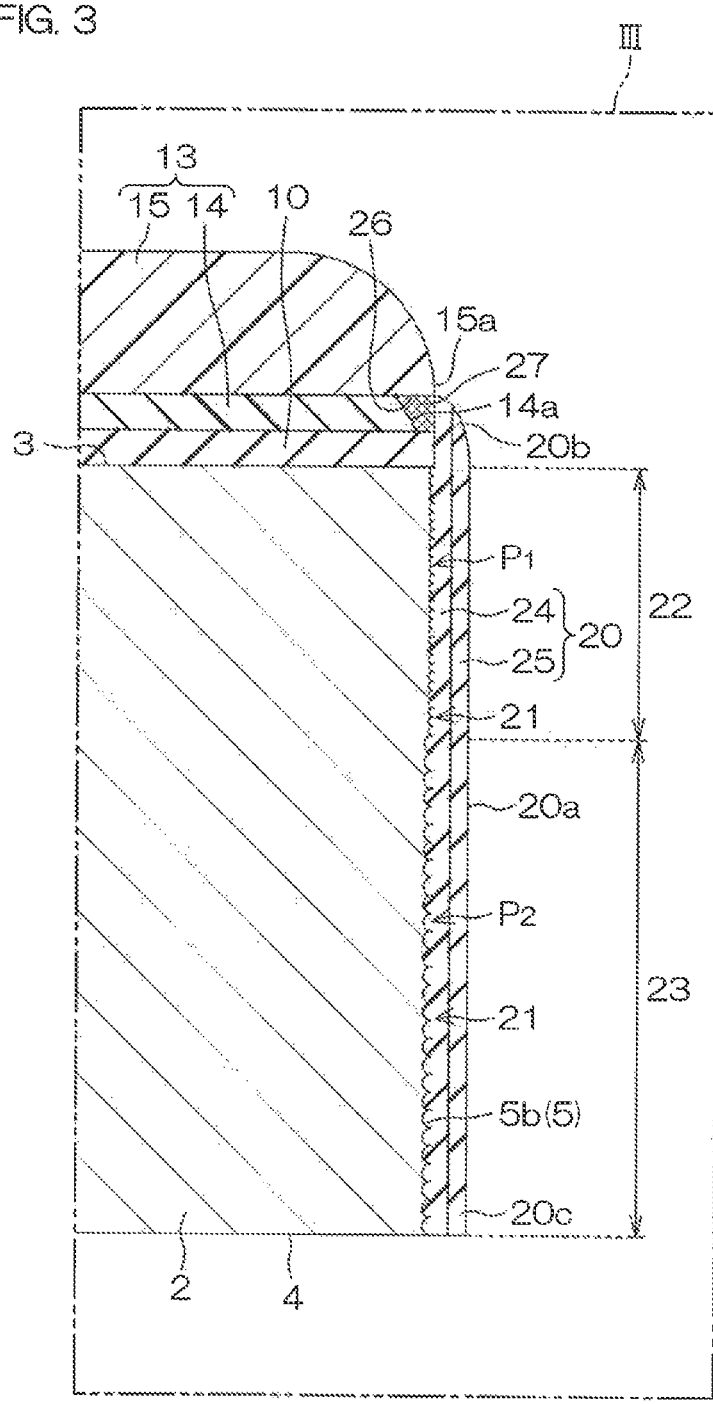

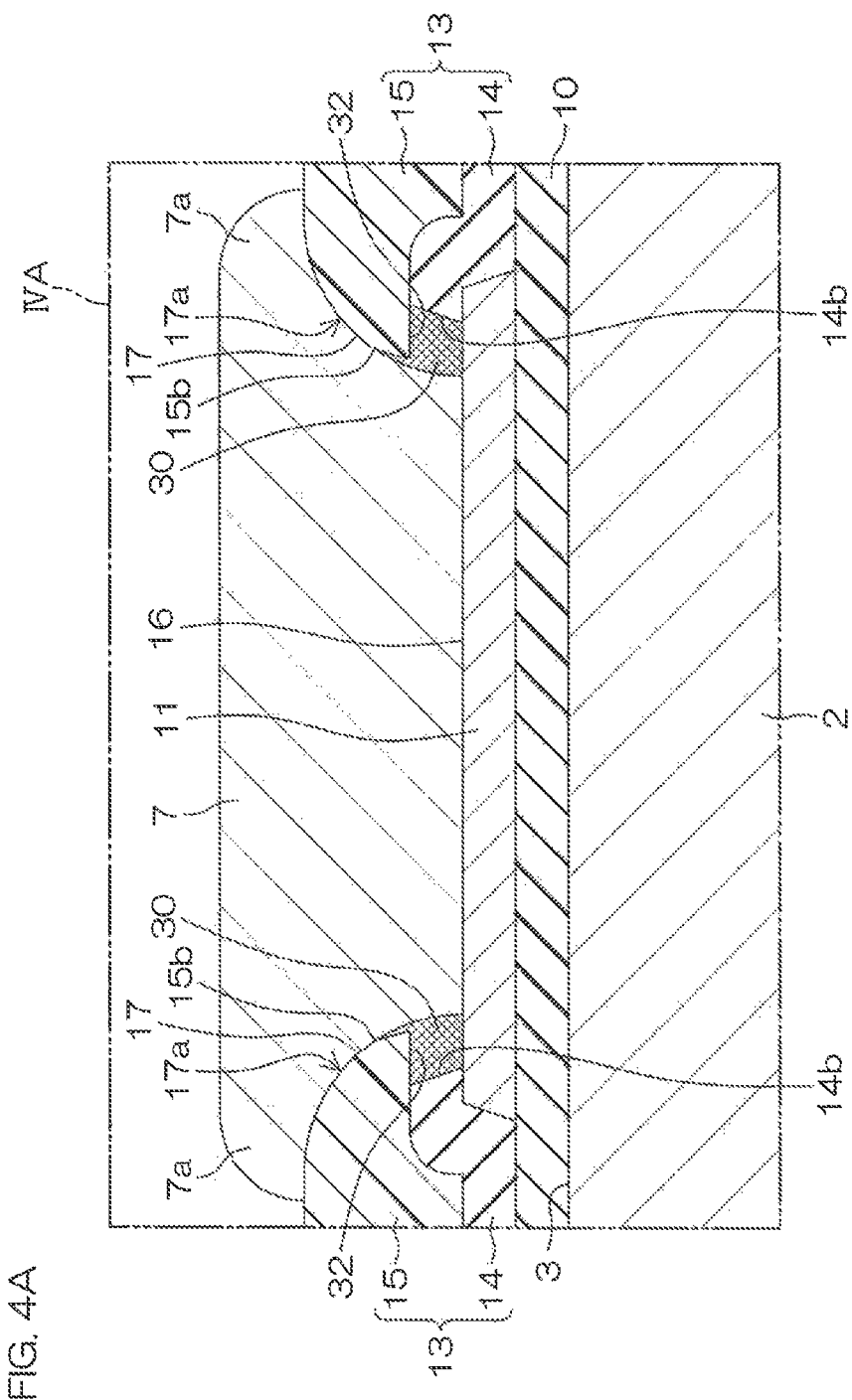

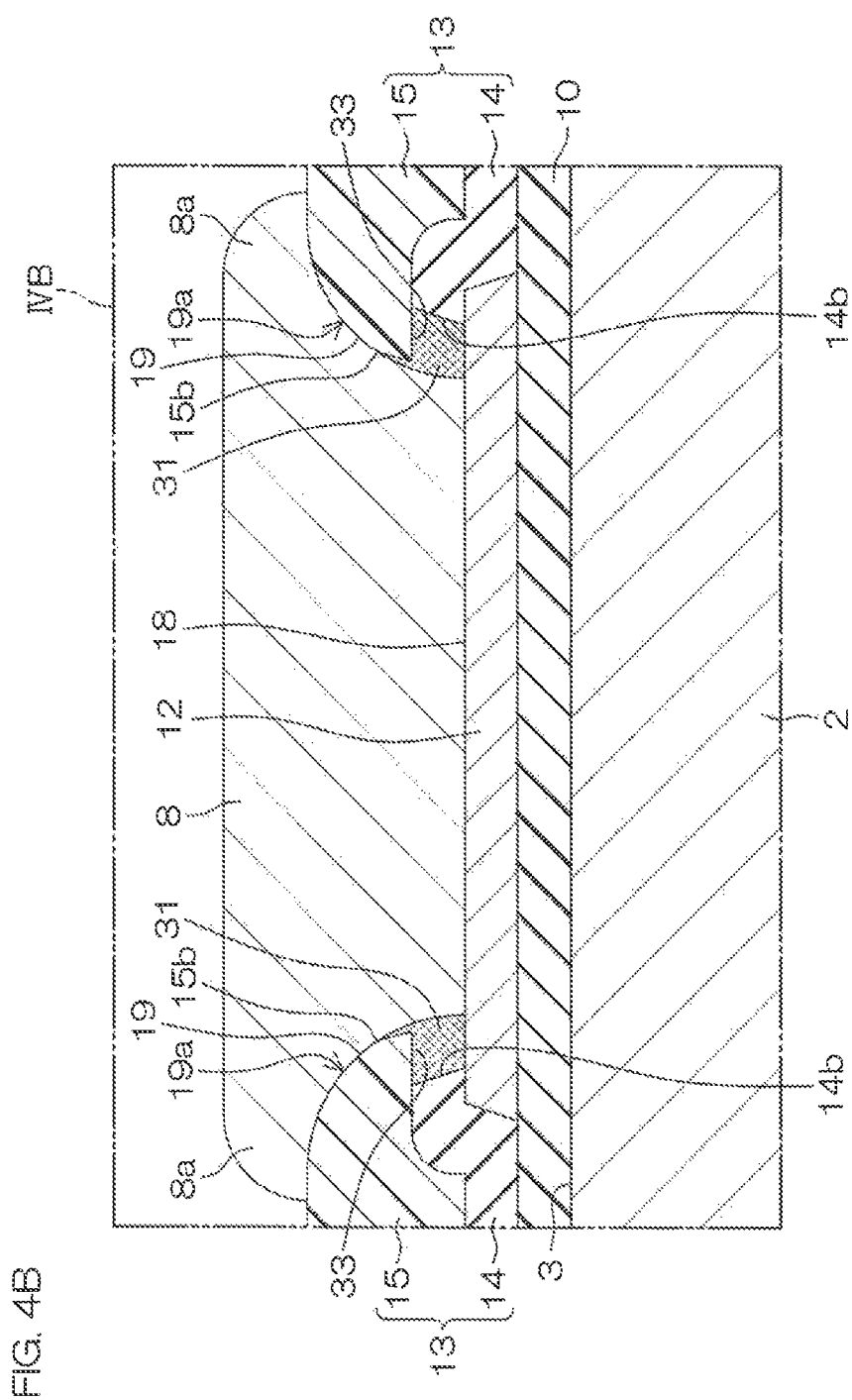

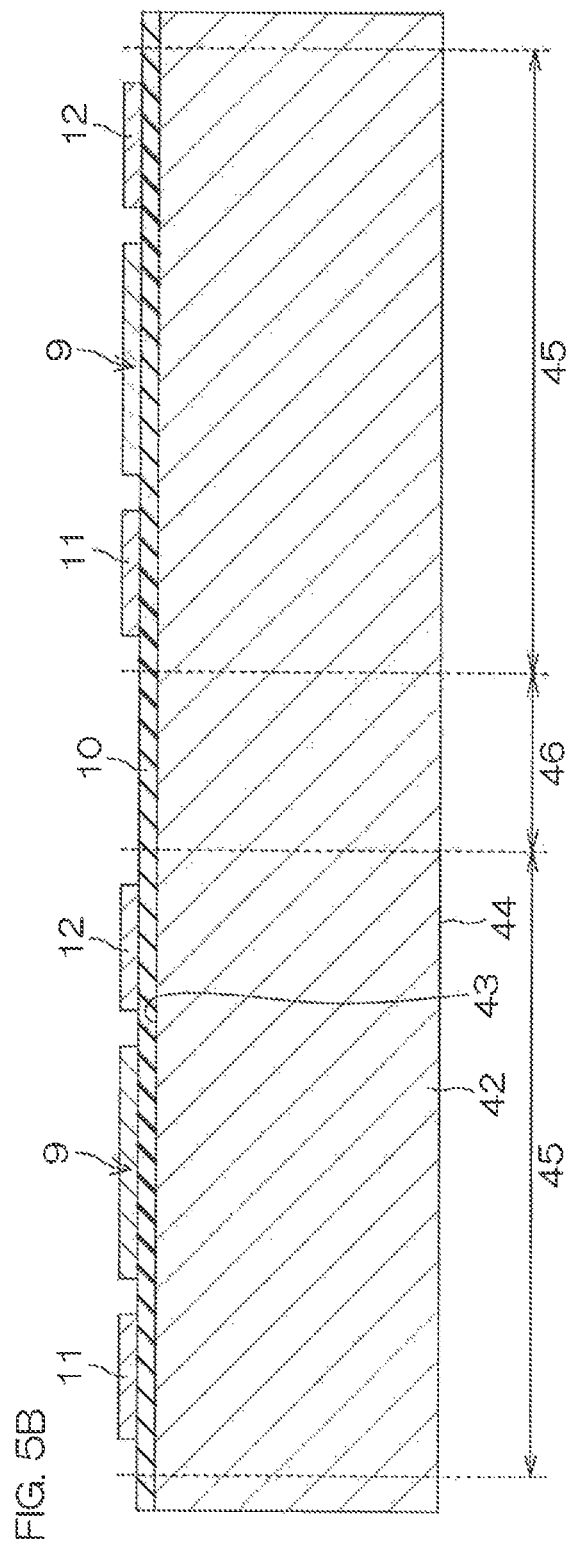

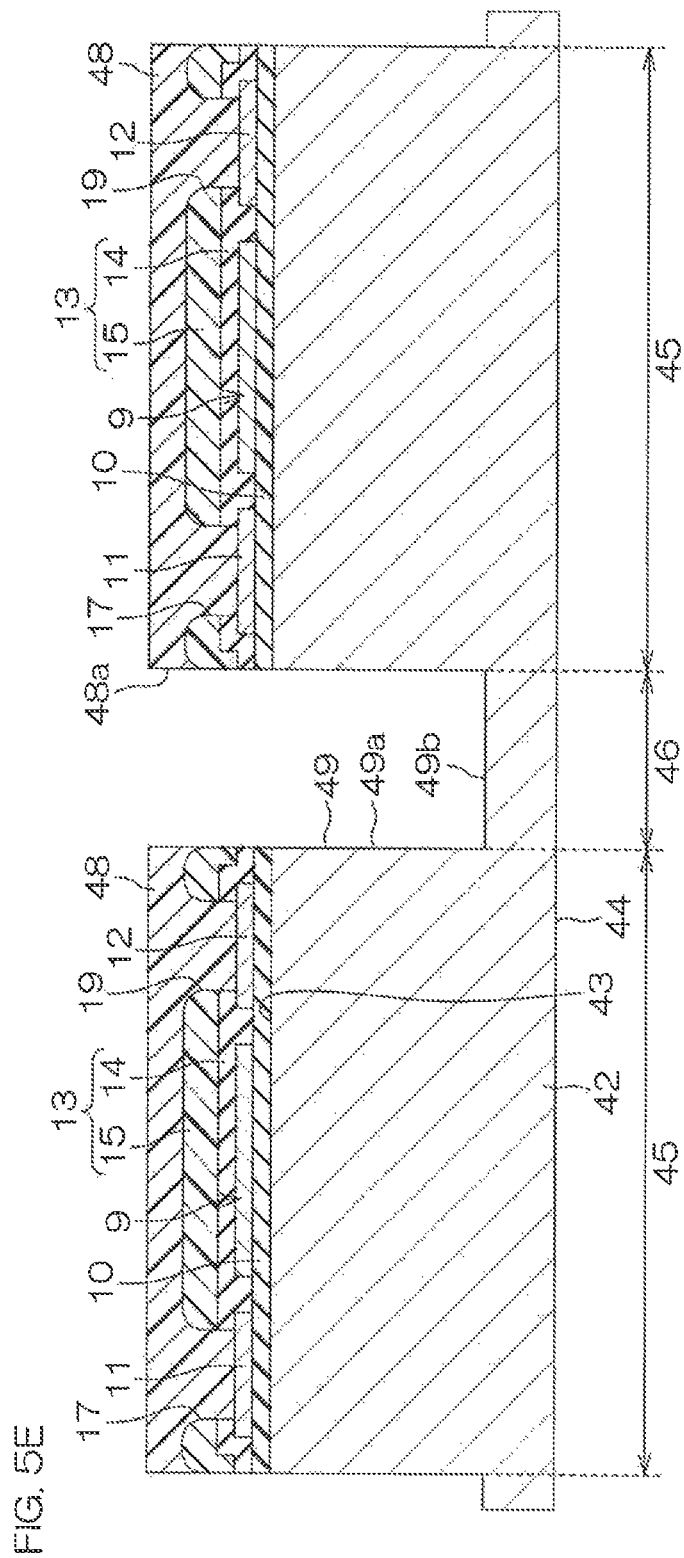

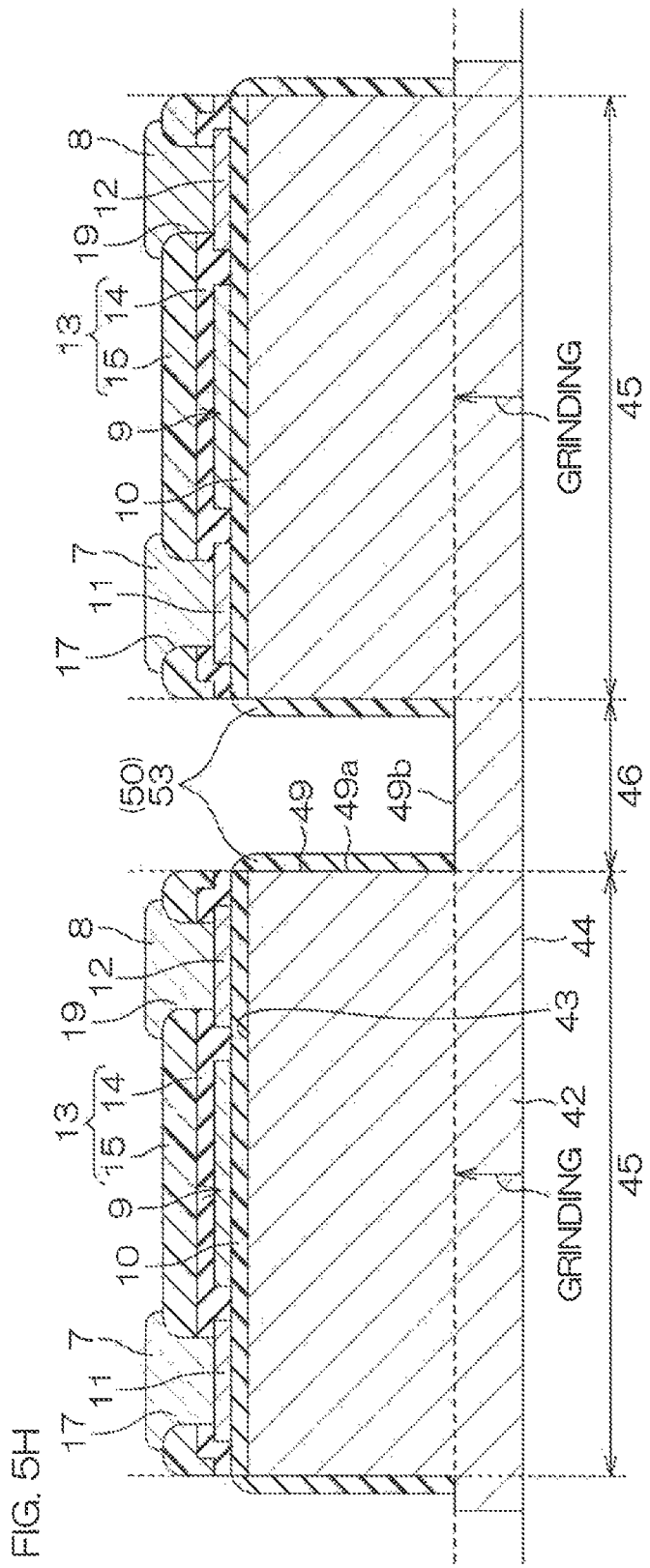

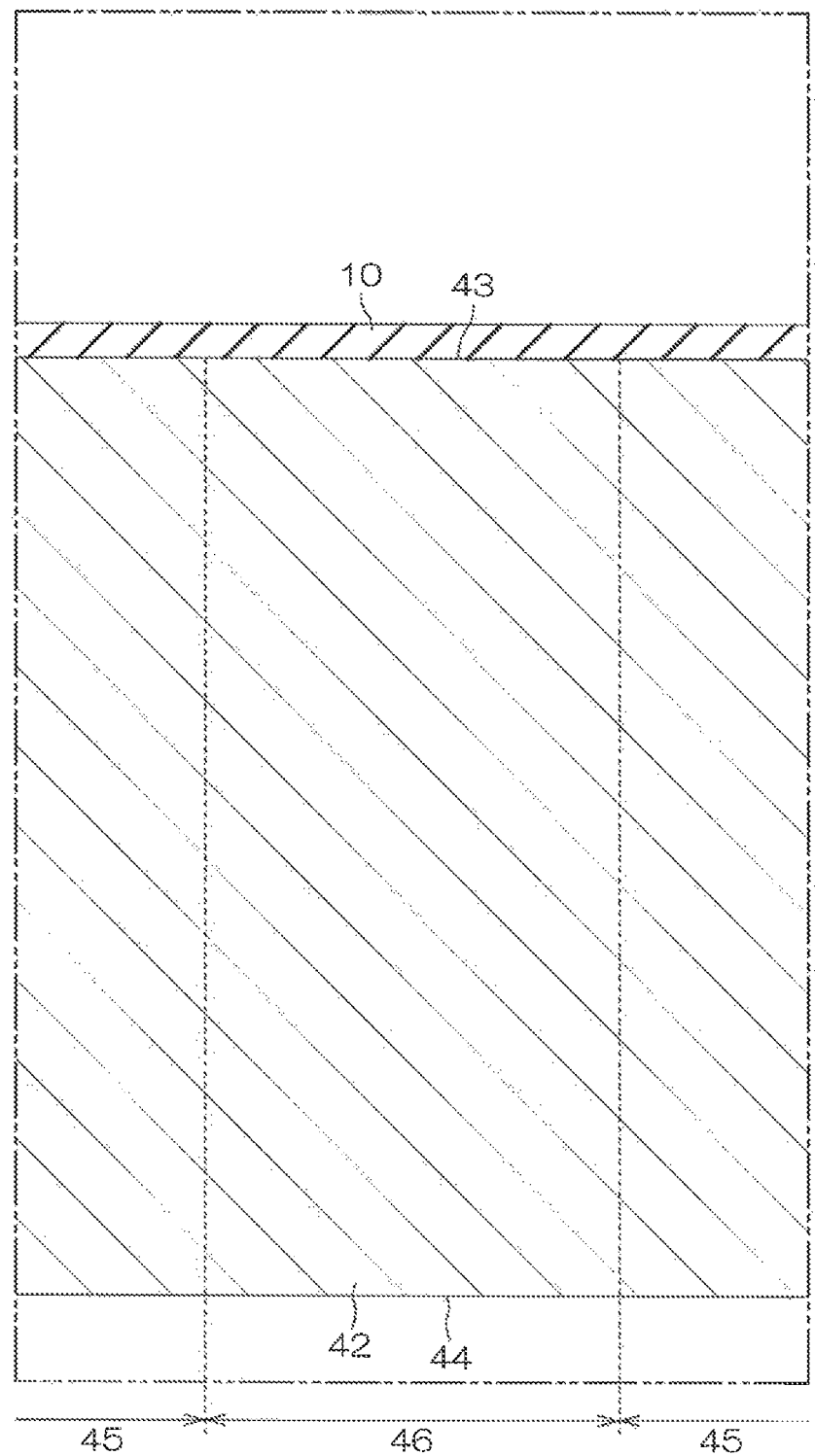

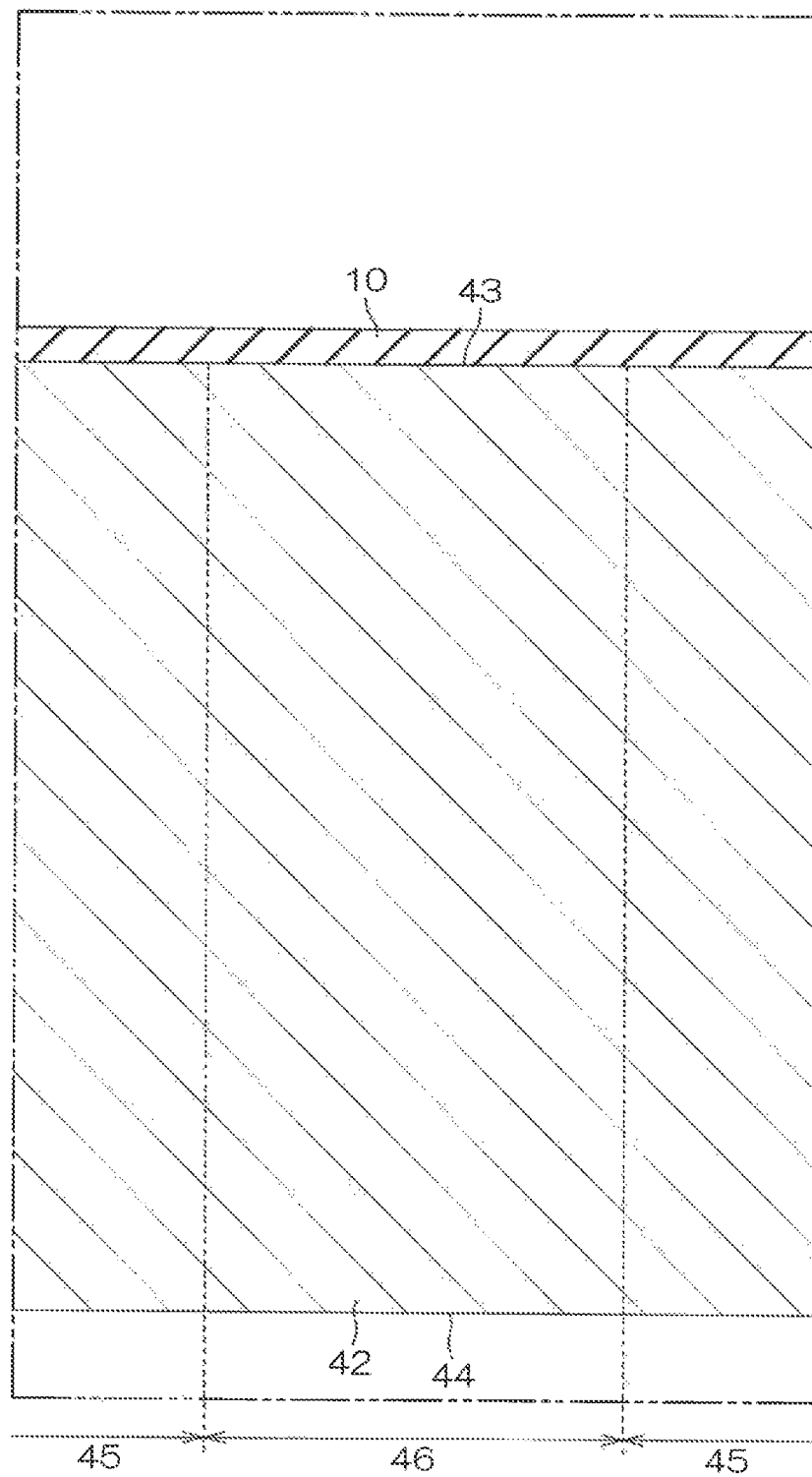

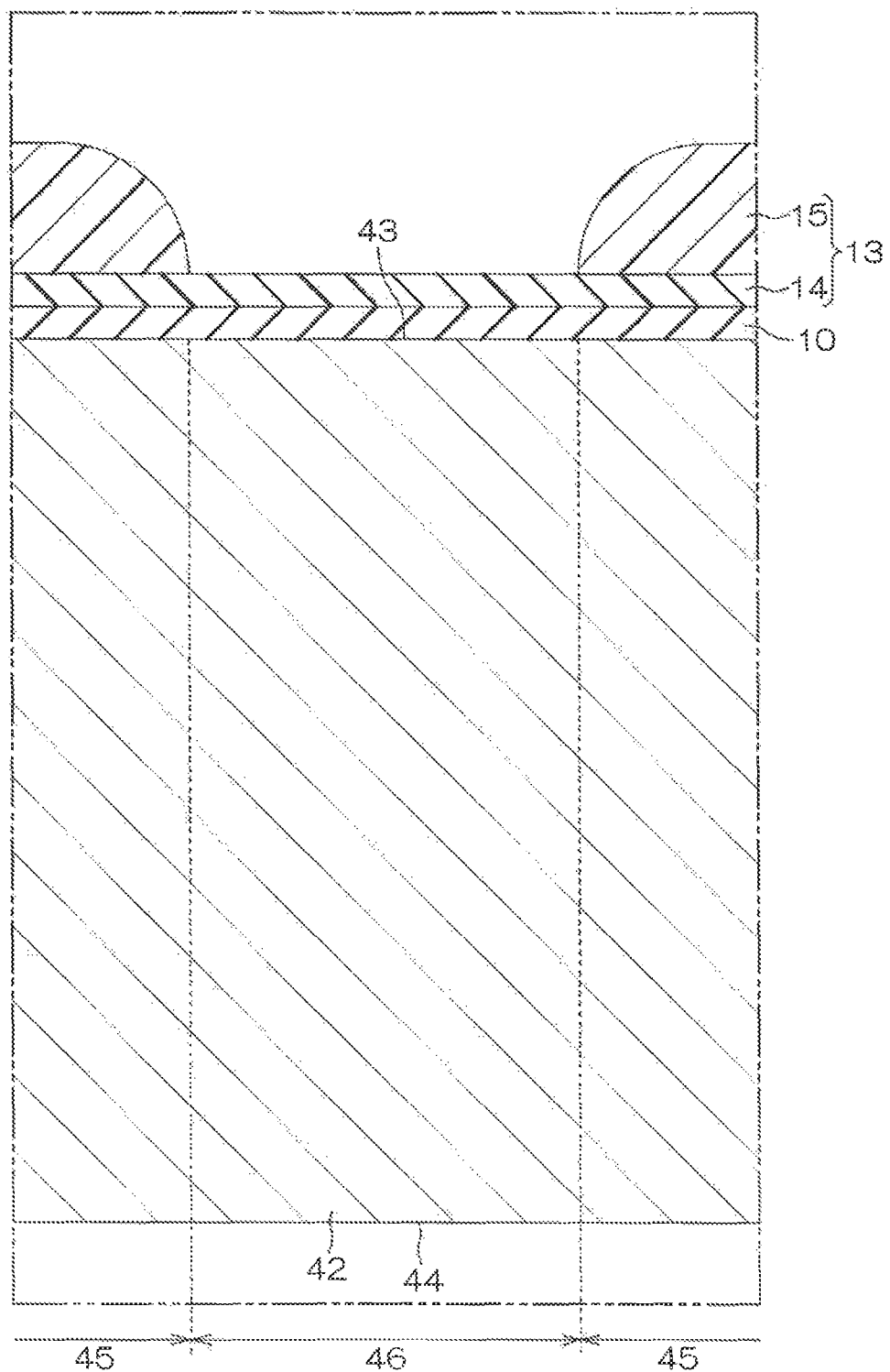

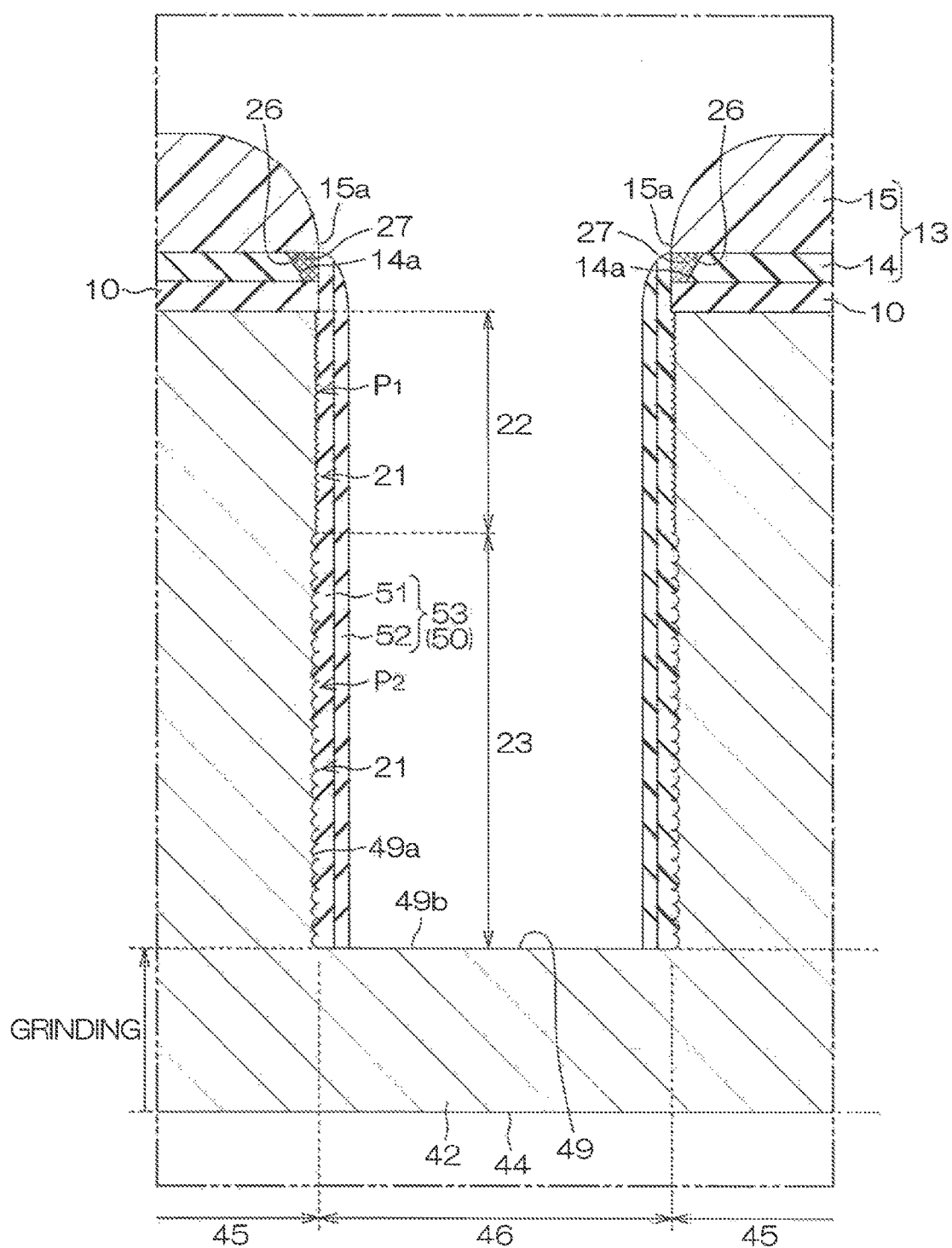

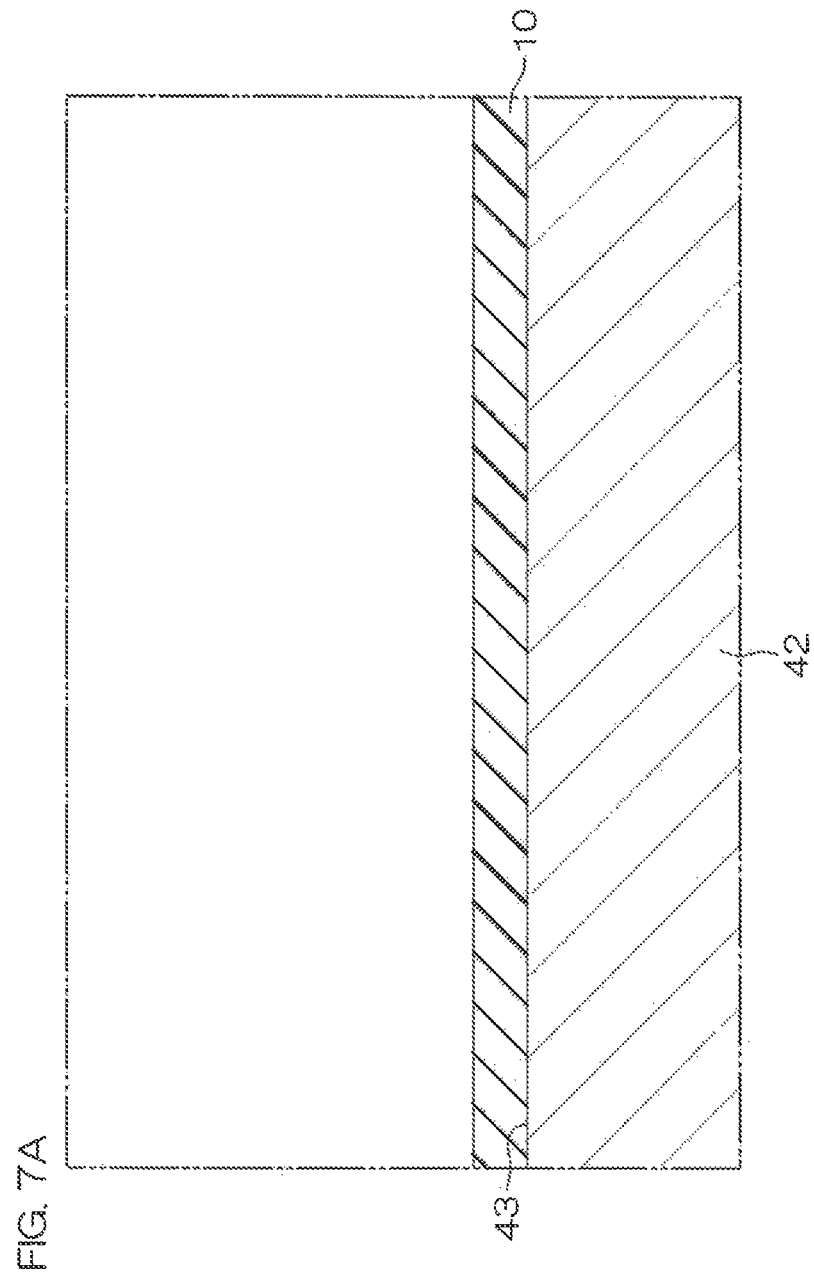

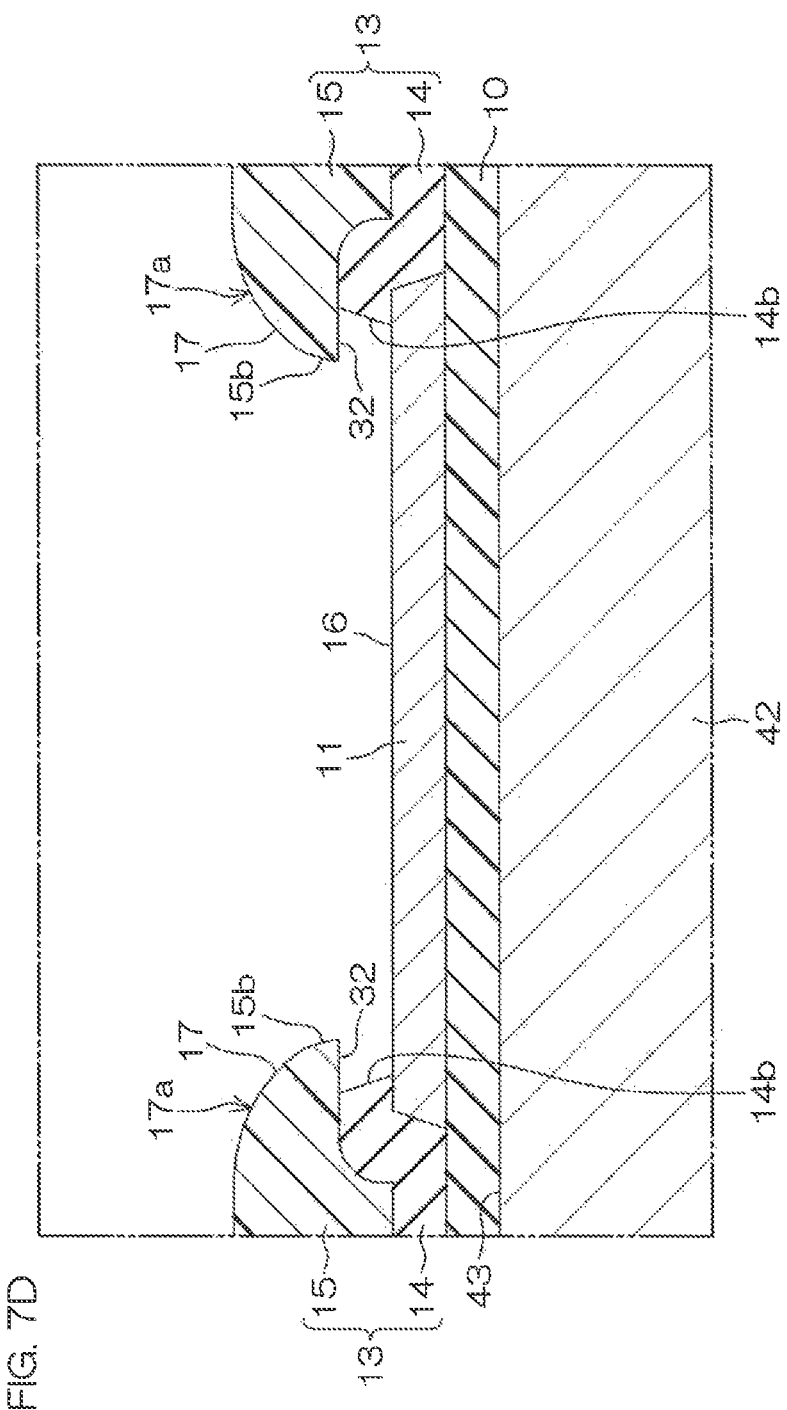

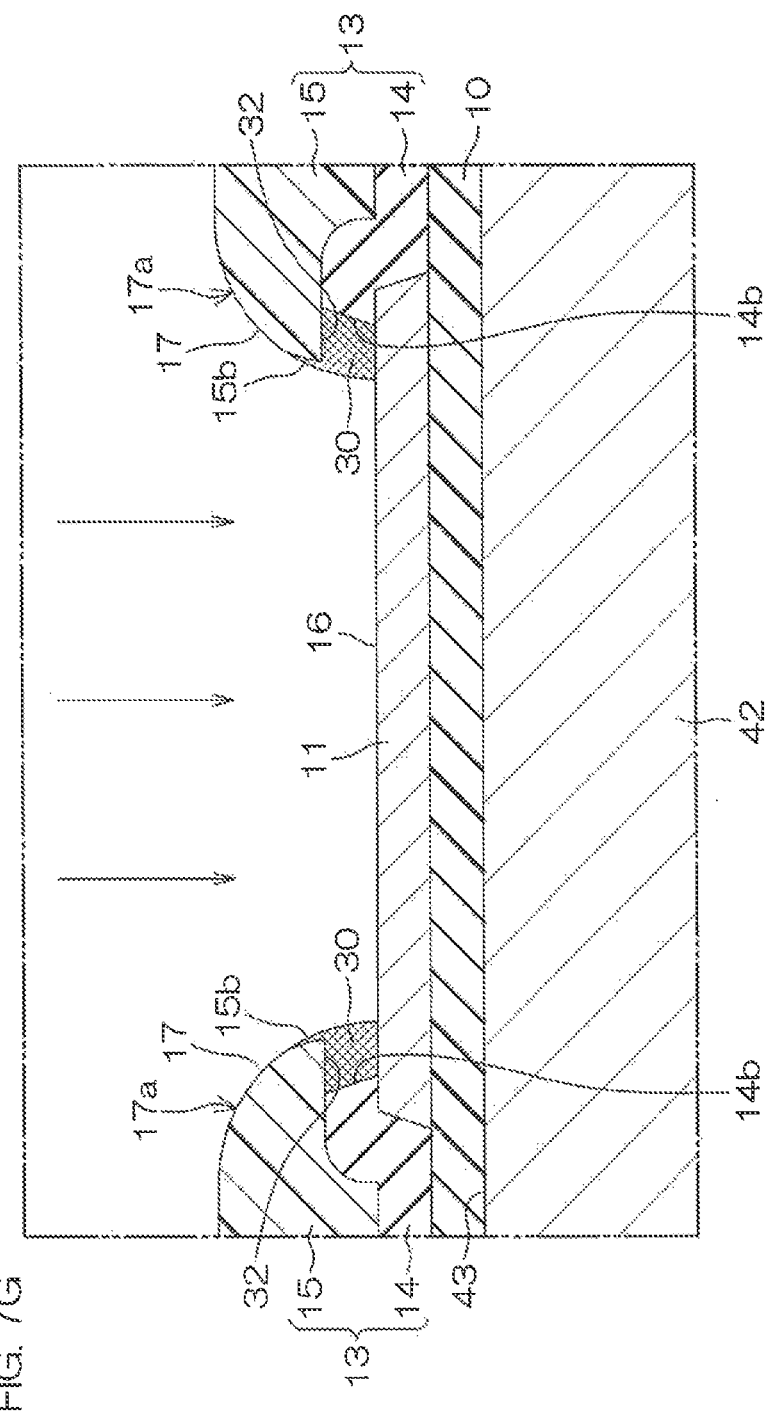

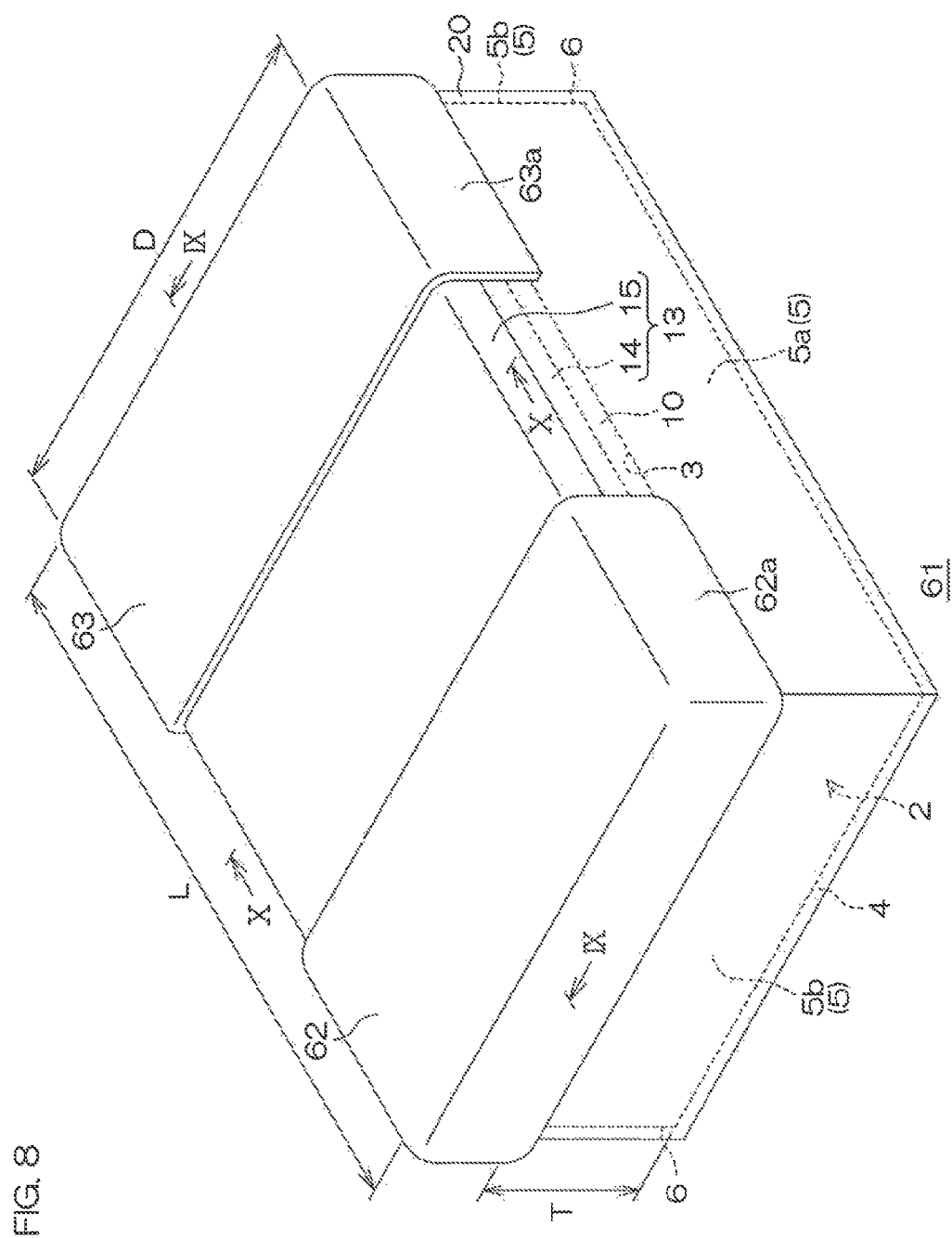

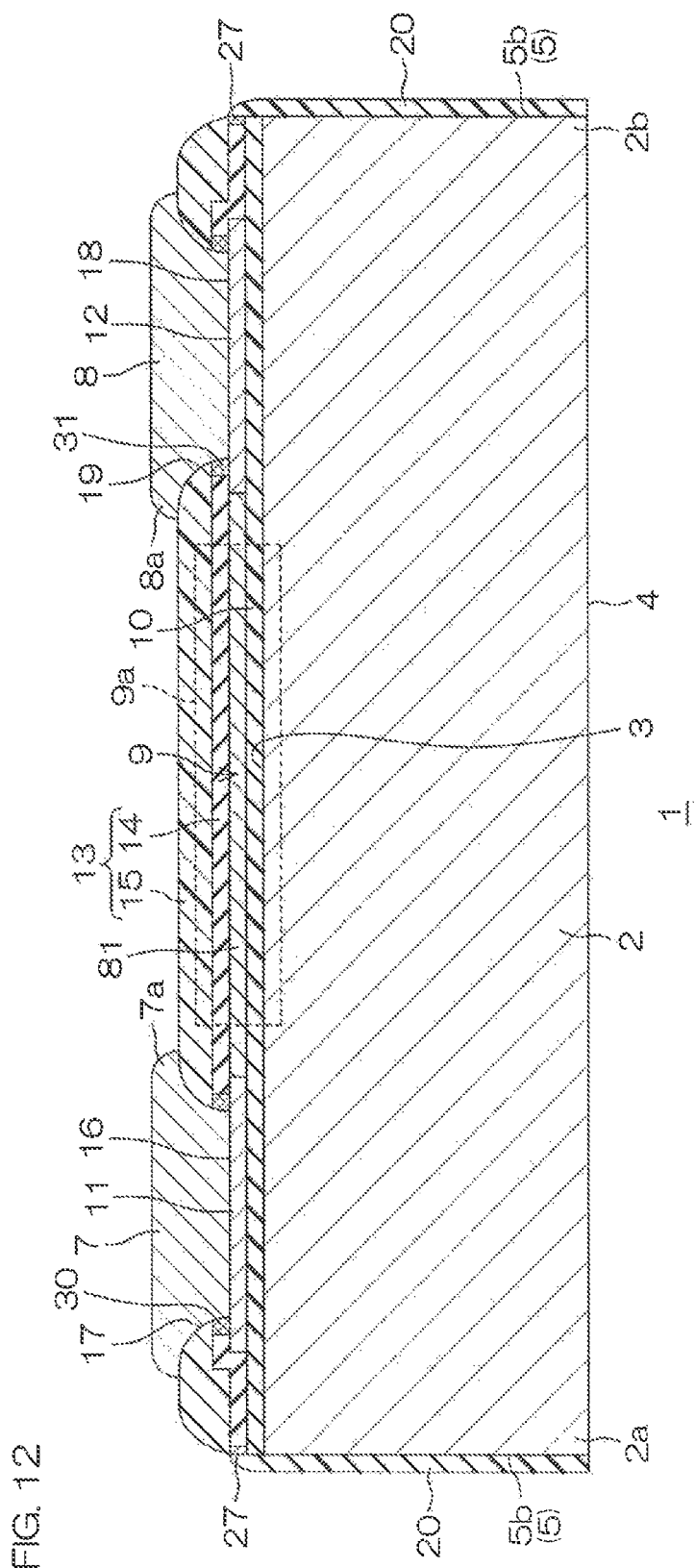

CHIP PART AND METHOD FOR MANUFACTURING A CHIP PART

BACKGROUND OF THE INVENTION

1. Field of the Invention

The present invention relates to a chip part that includes a substrate whose sidewall is coated with an insulating film, and relates to a method for manufacturing a chip part.

2. Description of the Related Art

In a small-sized electronic part that is referred to as a so-called chip part, in order to secure insulation properties against the outside of the electronic part and to protect a functional element formed inside of the electronic part, there is a case in which an insulating film is formed on a surface of the main body of the electronic part. For example, JP2011216821A discloses a chip part that includes a main element body in which a functional element is formed, an insulating film formed on a surface of the main element body, and a terminal electrode formed on an end surface of the main element body.

SUMMARY OF THE INVENTION

A chip part of the present invention includes a substrate that has an upper surface, a lower surface positioned on an opposite side of the upper surface, and a sidewall by which the upper surface and the lower surface are connected together and that has a plurality of concavo-convex portions formed on the sidewall from a side of the upper surface toward a side of the lower surface; a functional element formed at the side of the upper surface of the substrate; a first external electrode and a second external electrode that are arranged at the upper surface of the substrate so as to be electrically connected to the functional element; and a sidewall insulating film with which the sidewall of the substrate is coated so as to fill the plurality of concavo-convex portions formed on the sidewall of the substrate with the sidewall insulating film.

A method for manufacturing a chip part of the present invention includes a groove forming step of, in a base substrate that has an upper surface having a plurality of chip-part forming regions in each of which a functional element is formed and a lower surface positioned on an opposite side of the upper surface, forming a groove that partitions the chip-part forming region in the base substrate by partially removing a surface layer portion of the base substrate along a peripheral edge of the chip-part forming region and forming a plurality of concavo-convex portions on a sidewall of the groove from a side of the upper surface toward a side of the lower surface of the base substrate; an insulating film forming step of forming an insulating film with which an inner wall including the sidewall and a bottom wall of the groove is coated so as to fill the plurality of concavo-convex portions formed on the sidewall of the groove and with which the chip-part forming region is coated; a sidewall insulating film forming step of forming a sidewall insulating film with which the sidewall of the groove is coated in a self-aligned manner by selectively removing a part parallel to the upper surface of the base substrate so as to leave a part of the insulating film with which the sidewall of the groove is coated; an external electrode forming step of forming a first external electrode and a second external electrode that are electrically connected to the functional element on the chip-part forming region; and a segmentation step of cutting out a plurality of chip parts from the substrate by grinding the base substrate from the side of the lower surface until leading to the groove.

The aforementioned or other objects, features, and advantages of the present invention will become more apparent from the following description of preferred embodiments with reference to the accompanying drawings.

BRIEF DESCRIPTION OF THE DRAWINGS

FIG. 3 is an enlarged view of a portion surrounded by broken line III shown in FIG. 2.

FIG. 4A is an enlarged view of a portion surrounded by broken line IVA shown in FIG. 2.

FIG. 4B is an enlarged view of a portion surrounded by broken line IVB shown in FIG. 2.

FIG. 5B is a cross-sectional view showing a step subsequent to that of FIG. 5A.

FIG. 5E is a cross-sectional view showing a step subsequent to that of FIG. 5D.

FIG. 5H is a cross-sectional view showing a step subsequent to that of FIG. 5G.

FIG. 6A is an enlarged view corresponding to FIG. 3, showing a method for manufacturing the chip part shown in FIG. 1.

FIG. 6B is a cross-sectional view showing a step subsequent to that of FIG. 6A.

FIG. 6C is a cross-sectional view showing a step subsequent to that of FIG. 6B.

FIG. 6H is a cross-sectional view showing a step subsequent to that of FIG. 6G.

FIG. 7A is an enlarged view corresponding to FIG. 4A, showing a method for manufacturing the chip part shown in FIG. 1.

FIG. 7D is a cross-sectional view showing a step subsequent to that of FIG. 7C.

FIG. 7G is a cross-sectional view showing a step subsequent to that of FIG. 7F.

FIG. 8 is a perspective view of a chip part according to a second preferred embodiment of the present invention.

FIG. 12 is a cross-sectional view showing a chip part in which a resistor is employed as a functional element.

DETAILED DESCRIPTION OF THE PREFERRED EMBODIMENTS

Figure 1:
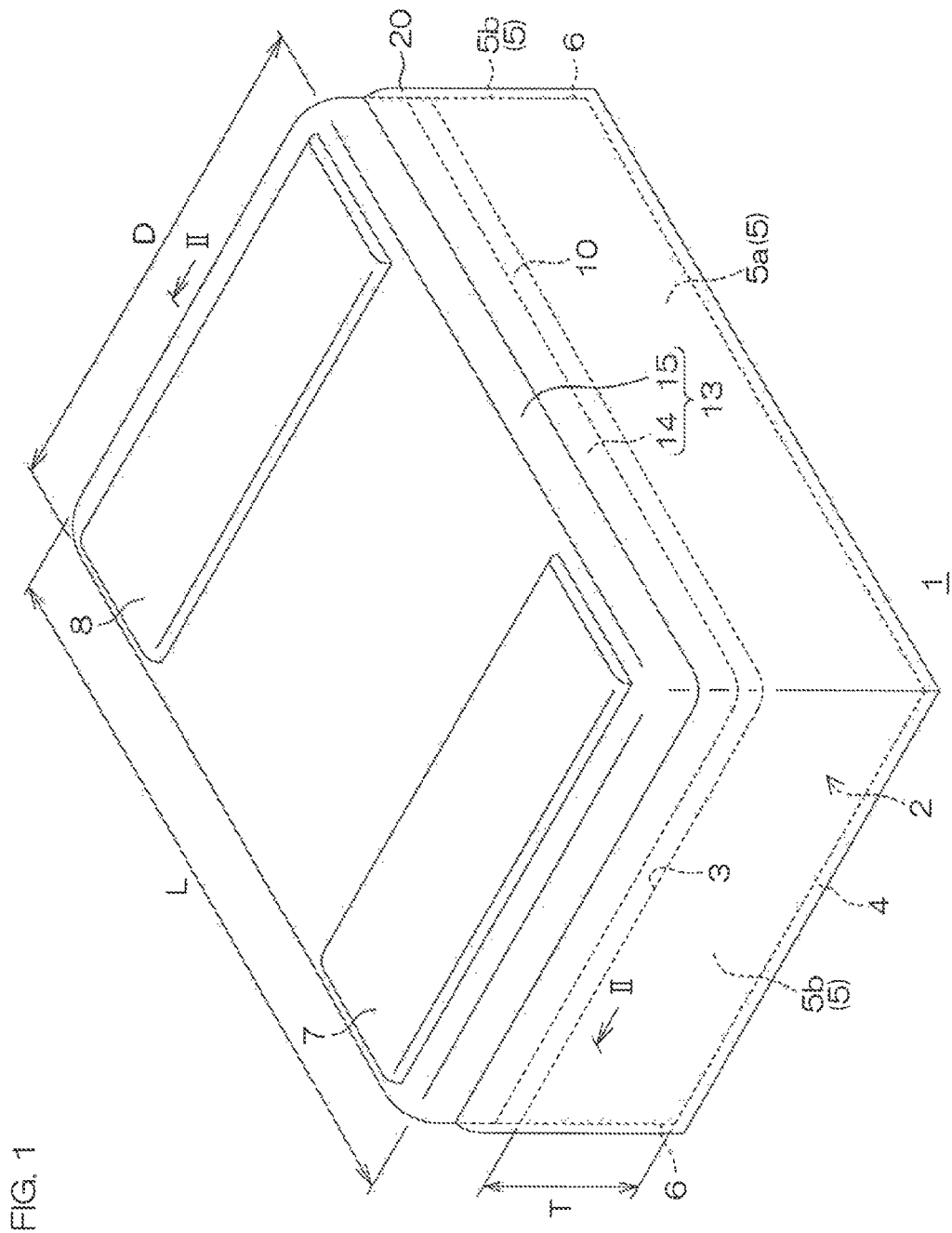
FIG. 1 is a perspective view of a chip part according to a first preferred embodiment of the present invention.

The present inventors have studied a chip part having a substrate where a functional element is formed at its upper surface side. In this type of chip part, the functional element is protected by a sidewall insulating film with which the sidewall of the substrate is coated, and therefore there is a need to form a sidewall insulating film with which the sidewall of the substrate is excellently coated.

The present preferred embodiment provides a chip part capable of excellently protecting a functional element by a sidewall insulating film formed on a sidewall of a substrate, and provides a method for manufacturing a chip part. Additionally, the present preferred embodiment provides a method for manufacturing a chip part that is capable of easily and excellently forming a sidewall insulating film on the sidewall of the substrate.

A chip part of the present preferred embodiment includes a substrate that has an upper surface, a lower surface positioned on an opposite side of the upper surface, and a sidewall by which the upper surface and the lower surface are connected together and that has a plurality of concavo-convex portions formed on the sidewall from a side of the upper surface toward a side of the lower surface; a functional element formed at the side of the upper surface of the substrate; a first external electrode and a second external electrode that are arranged at the upper surface of the substrate so as to be electrically connected to the functional element; and a sidewall insulating film with which the sidewall of the substrate is coated so as to fill the plurality of concavo-convex portions formed on the sidewall of the substrate with the sidewall insulating film.

In the chip part of the present preferred embodiment, the plurality of concavo-convex portions are formed on the sidewall of the substrate, and the sidewall insulating film is formed so as to fill the concavo-convex portions therewith. This makes it possible to increase the contact area of the sidewall insulating film with respect to the sidewall of the substrate and to improve adhesive properties, and hence makes it possible to excellently coat the sidewall of the substrate by the sidewall insulating film. Therefore, it is possible to provide the chip part capable of protecting the functional element by the sidewall insulating film.

A method for manufacturing a chip part of a present preferred embodiment includes a groove forming step of, in a base substrate that has an upper surface having a plurality of chip-part forming regions in each of which a functional element is formed and a lower surface positioned on an opposite side of the upper surface, forming a groove that partitions the chip-part forming region in the base substrate by partially removing a surface layer portion of the base substrate along a peripheral edge of the chip-part forming region and forming a plurality of concavo-convex portions on a sidewall of the groove from a side of the upper surface toward a side of the lower surface of the base substrate; an insulating film forming step of forming an insulating film with which an inner wall including the sidewall and a bottom wall of the groove is coated so as to fill the plurality of concavo-convex portions formed on the sidewall of the groove and with which the chip-part forming region is coated; a sidewall insulating film forming step of forming a sidewall insulating film with which the sidewall of the groove is coated in a self-aligned manner by selectively removing a part parallel to the upper surface of the base substrate so as to leave a part of the insulating film with which the sidewall of the groove is coated; an external electrode forming step of forming a first external electrode and a second external electrode that are electrically connected to the functional element on the chip-part forming region; and a segmentation step of cutting out a plurality of chip parts from the substrate by grinding the base substrate from the side of the lower surface until leading to the groove.

In the method for manufacturing the chip part of the present preferred embodiment, the plurality of concavo-convex portions are formed on the sidewall of the groove in the groove forming step. Therefore, it is possible to improve film-forming properties (contact area and adhesive properties) of the sidewall insulating film with respect to the sidewall of the groove. Additionally, the sidewall insulating film with which the sidewall of the groove is coated is formed in the self-aligned manner with respect to the chip-part forming region, and becomes a sidewall insulating film with which a sidewall of a substrate is coated in a chip part by undergoing the segmentation step. Therefore, it is possible to provide the method for manufacturing the chip part that is capable of excellently protecting the functional element by the sidewall insulating film formed on the sidewall of the substrate. Additionally, it is possible to provide the method for manufacturing the chip part that is capable of easily and excellently forming the sidewall insulating film on the sidewall of the substrate.

A plurality of preferred embodiments of the present invention will be hereinafter described in detail with reference to the accompanying drawings.

First Preferred Embodiment

Figure 2:
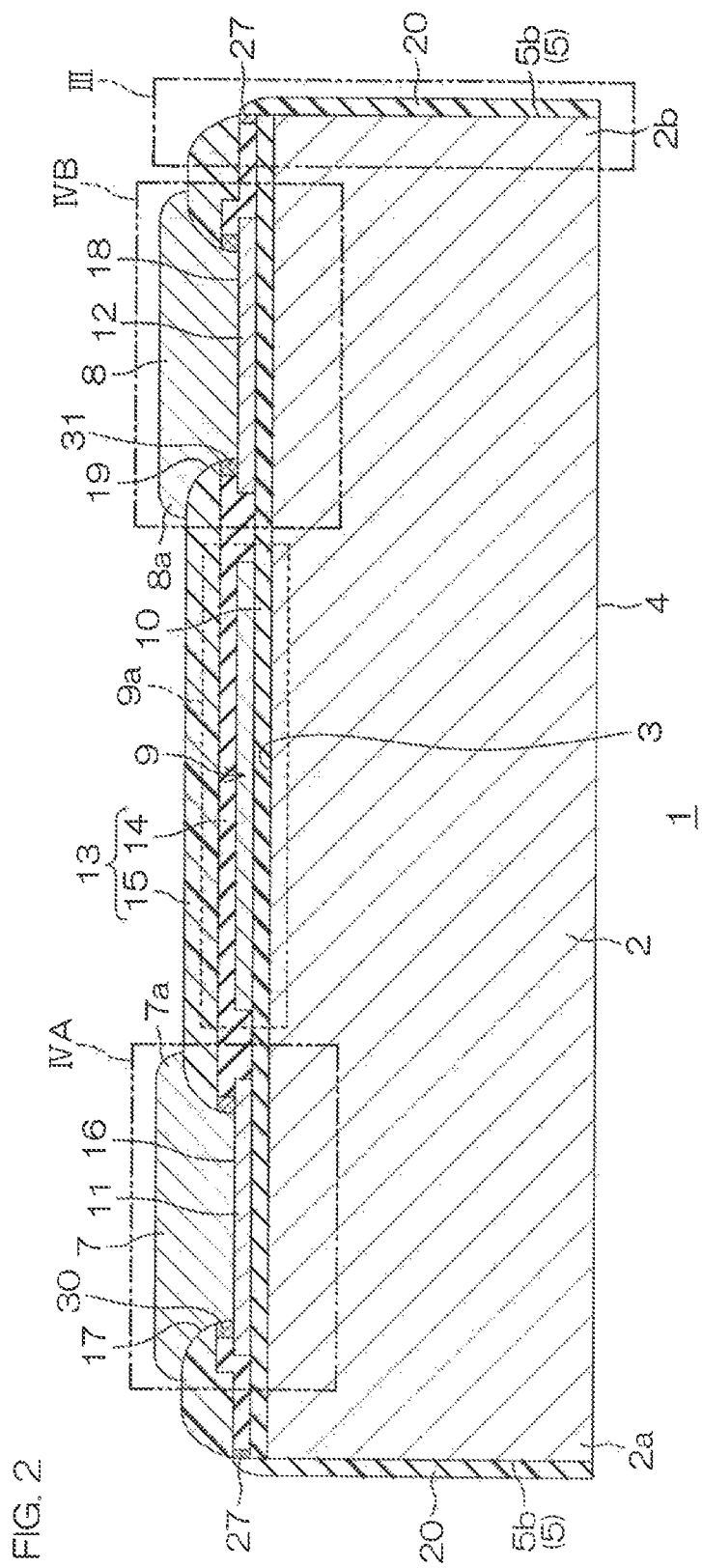
FIG. 2 is a longitudinal sectional view along line II-II shown in FIG. 1.

FIG. 1 is a perspective view of a chip part 1 according to a first preferred embodiment of the present invention. FIG. 2 is a longitudinal sectional view along line II-II shown in FIG. 1.

The chip part 1 is a small-sized electronic part that is referred to as a so-called 0603 (0.6 mm×0.3 mm) chip, a so-called 0402 (0.4 mm×0.2 mm) chip, a so-called 03015 (0.3 mm×0.15 mm) chip, or the like.

As shown in FIG. 1 and FIG. 2, the chip part 1 includes a substrate 2 forming a main chip body. The substrate 2 includes an upper surface 3 that has a rectangular shape in a plan view, a lower surface 4 that is positioned on an opposite side of the upper surface 3 and that has substantially the same shape as the upper surface 3, and four sidewalls 5 by which the upper surface and the lower surface 4 are connected together. Hereinafter, among the four sidewalls 5, the sidewalls 5 extending in a longitudinal direction of the substrate 2 are each referred to as a longitudinal sidewall 5a, and the sidewalls 5 extending in a lateral direction (i.e., short-length direction) of the substrate 2 are each referred to as a lateral sidewall 5b.

A length L of the longitudinal sidewall 5a of the substrate 2 is, for example, from 0.3 mm to 0.6 mm. A length D of the lateral sidewall 5b of the substrate 2 is, for example, from 0.15 mm to 0.3 mm. A thickness T of the substrate 2 is, for example, from 0.1 mm to 0.2 mm. Each corner portion 6 of the substrate 2 may have a chamfered round shape in the plan view. The round shape makes it possible to disperse an external force along its circumferential direction, and therefore it is possible to restrain the corner portion 6 from causing cracks.

A first external electrode 7 and a second external electrode 8 are arranged at the upper surface 3 of the substrate 2. The first external electrode 7 is arranged at a side of one end portion 2a of the substrate 2. The second external electrode 8 is arranged at a side of other end portion 2b of the substrate 2. The first external electrode 7 and the second external electrode 8 are each formed in a rectangular shape along the lateral sidewall 5b of the substrate 2 in the plan view. A functional-element forming region 9a in which a functional element 9 is formed is set to a region between the first external electrode 7 and the second external electrode 8 in a side of the upper surface 3 of the substrate 2. Although the functional element 9 is simplified and represented by one conductor film in FIG. 2, various elements, such as a resistor and a capacitor, can be employed as the functional element 9. The first external electrode 7 and the second external electrode 8 are electrically connected to the functional element 9 formed in the functional-element forming region 9a.

As shown in FIG. 2, an upper-surface insulating film 10 is arranged on the upper surface 3 of the substrate 2. The upper-surface insulating film 10 coats a whole region of the upper surface 3 of the substrate 2 so as to be contiguous to the upper surface 3 of the substrate 2. The upper-surface insulating film 10 may be an $SiO_2$ film or an SiN film. A first pad film 11 and a second pad film 12 that are electrically connected to the functional element 9 are arranged on the upper-surface insulating film 10.

The first pad film 11 is arranged in a region directly under the first external electrode 7, and is formed in, for example, a four-sided rectangular shape in the plan view along the lateral sidewall 5b of the substrate 2. The second pad film 12 is arranged in a region directly under the second external electrode 8, and is formed in, for example, a four-sided rectangular shape in the plan view along the lateral sidewall 5b of the substrate 2. The first pad film 11 and the second pad film 12 may be each made of a conductive material including Cu or Al, such as Cu, Al, AlSi, or AlCu.

An insulating layer 13 is formed on the upper-surface insulating film 10 so as to coat the functional element 9, the first pad film 11, and the second pad film therewith. The insulating layer 13 includes a passivation film 14 and a resin film 15 laminated in this order from a side of the upper-surface insulating film 10. The passivation film 14 includes, for example, $SiO_2$ or SiN. The resin film 15 includes, for example, polyimide.

The insulating layer 13 has a first pad opening 17 that exposes a region excluding an edge of the first pad film 11 as a first pad region 16. The first external electrode 7 is arranged in the first pad opening 17. The first external electrode 7 is electrically connected to the first pad region 16 in the first pad opening 17. The first external electrode 7 is electrically connected to the functional element 9 via the first pad film 11. The first external electrode 7 is formed so as to protrude from the insulating layer 13, and has a coating portion 7a with which an upper-surface of the insulating layer 13 is coated. The first external electrode 7 may be an Ni/Pd/Au laminated film that includes an Ni film, a Pd film, and an Au film laminated in this order from a side of the substrate 2.

The insulating layer 13 has a second pad opening 19 that exposes a region excluding an edge of the second pad film 12 as a second pad region 18. The second external electrode 8 is arranged in the second pad opening 19. The second external electrode 8 is electrically connected to the second pad region 18 in the second pad opening 19. The second external electrode 8 is electrically connected to the functional element 9 via the second pad film 12. The second external electrode 8 is formed so as to protrude from the insulating layer 13, and has a coating portion 8a with which the upper surface of the insulating layer 13 is coated. The second external electrode 8 may be an Ni/Pd/Au laminated film that includes an Ni film, a Pd film, and an Au film laminated in this order from the side of the substrate 2.

As shown in FIG. 1 and FIG. 2, a sidewall insulating film 20 is formed on the sidewall 5 of the substrate 2 so as to coat a whole region of the sidewall 5 of the substrate 2 therewith. A detailed description will be hereinafter given of the sidewall insulating film 20 and a structure around the sidewall insulating film 20. FIG. 3 is an enlarged view of a portion surrounded by broken line III shown in FIG. 2. FIG. 4A is an enlarged view of a portion surrounded by broken line IVA shown in FIG. 2. FIG. 4B is an enlarged view of a portion surrounded by broken line IVB shown in FIG. 2.

As shown in FIG. 3, one feature of the chip part 1 according to the present preferred embodiment resides in that a plurality of concavo-convex portions 21 are formed on the sidewall 5 of the substrate 2 from a side of the upper surface 3 of the substrate 2 toward a side of the lower surface 4 of the substrate 2 and in that the sidewall 5 of the substrate 2 is coated with the sidewall insulating film 20 so as to fill the concavo-convex portions 21 therewith. The thus formed configuration makes it possible to improve film formation properties (i.e., contact area and adhesive properties) of the sidewall insulating film 20 with respect to the sidewall 5 of the substrate 2, and makes it possible to excellently protect the functional element 9.

The concavo-convex portions 21 formed on the sidewall 5 of the substrate 2 are formed in streaks that extend in parallel with each other along a side line of the sidewall 5 of the substrate 2. Therefore, the concavo-convex portions 21 are formed in streaks that extend in the longitudinal direction of the substrate 2 in the longitudinal sidewall 5a of the substrate 2, whereas the concavo-convex portions 21 are formed in streaks that extend in the lateral direction of the substrate 2 in the lateral sidewall 5b of the substrate 2.

The concavo-convex portions 21 are formed with different pitches from the side of the upper surface 3 of the substrate 2 toward the side of the lower surface 4 thereof. In more detail, the concavo-convex portions 21 having a comparatively small pitch are formed in a region on the side of the upper surface 3 of the substrate 2, whereas the concavo-convex portions 21 having a comparatively large pitch are formed in a region on the side of the lower surface 4 of the substrate 2. The pitch of the concavo-convex portion 21 may be, for example, 1/100 or less (about 0.1 µm to 2 µm) of the thickness T (=0.1 mm or more and 0.2 mm or less) of the substrate 2. The concavo-convex portion 21 includes a plurality of concave portions. The "pitch of the concavo-convex portion 21" is defined by a width of one concave portion in a thickness direction of the substrate 2.

FIG. 3 shows an example that has a first concavo-convex-portion forming region 22 including the plurality of concavo-convex portions 21 formed with a first pitch $P_1$ in a region closer to the upper surface 3 of the substrate 2 and a second concavo-convex-portion forming region 23 including the plurality of concavo-convex portions 21 formed with a second pitch $P_2$ larger than the first pitch $P_1$ ($P_2 > P_1$) in a region closer to the lower surface 4 of the substrate 2. It is permissible to employ a formation in which the plurality of concavo-convex portions 21 are formed on the sidewall 5 of the substrate 2 so that the pitch gradually increases from the side of the upper surface 3 of the substrate 2 toward the side of the lower surface 4 thereof.

The sidewall insulating film 20 with which the sidewall 5 of the substrate 2 is coated is formed so that the surface 20a positioned on an opposite side of the sidewall 5 of the substrate 2 becomes flat. In the present preferred embodiment, the sidewall insulating film 20 is a laminated film formed by laminating a plurality of insulating films, and includes a first insulating film 24 contiguous to the sidewall 5 of the substrate 2 and a second insulating film 25 with which the first insulating film 24 is coated so as to be contiguous to the first insulating film 24. The first insulating film 24 and the second insulating film 25 may be formed by the same insulating material or may be formed by mutually different insulating materials. $SiO_2$ or SiN can be mentioned as the insulating material of the first insulating film 24 and as that of the second insulating film 25. The sidewall insulating film 20 may be formed by a single insulating film ($SiO_2$ film or SiN film).

The upper-surface insulating film 10 and a part (the passivation film 14 in the present preferred embodiment) of the insulating layer 13, in addition to the sidewall 5 of the substrate 2, are coated with the sidewall insulating film 20 extending from a side of the sidewall 5 of the substrate 2. A part of the resin film 15 may be coated with the sidewall insulating film 20. An upper end portion 20b closer to the upper surface 3 of the substrate 2 in the sidewall insulating film 20 is formed in a curved shape that is rounded outwardly from the substrate 2.

Preferably, the upper end portion 20b of the sidewall insulating film 20 is flush with the resin film without differences in level. It is possible to restrain a crack from occurring at the upper end portion 20b of the sidewall insulating film 20 and/or at the resin film 15 by removing differences in level between the upper end portion 20b of the sidewall insulating film 20 and the resin film 15. A lower end portion 20c closer to the lower surface 4 of the substrate 2 in the sidewall insulating film 20 has a bottom surface formed so as to be flush with the lower surface 4 of the substrate 2.

In the insulating layer 13, a sidewall 14a of the passivation film 14 positioned at a side of the sidewall 5 of the substrate 2 is placed at an inner region side of the substrate 2 than a sidewall 15a of the resin film 15 positioned at the side of the sidewall 5 of the substrate 2. In the present preferred embodiment, the sidewall 15a of the resin film 15 is formed in a curved shape that is rounded outwardly from the substrate 2. A hollow 26 is defined by the upper-surface insulating film 10, the sidewall 14a of the passivation film 14, and the resin film 15.

A peripheral-edge insulating film 27 includes the same insulating material as the sidewall insulating film 20 (the first insulating film 24 in the present preferred embodiment) is formed in the hollow 26. The peripheral-edge insulating film 27 is formed integrally with the sidewall insulating film 20 by filling the hollow therewith. This peripheral-edge insulating film 27 makes it possible to restrain a crack from occurring in the resin film 15 at the side of the sidewall 5 of the substrate 2. To suppress the occurrence of a crack in the resin film 15 is effective in improving adhesive properties of the sidewall insulating film 20 with respect to the sidewall 5 of the substrate 2.

In the present preferred embodiment, the plurality of concavo-convex portions 21 are formed on the sidewall 5 of the substrate 2 and therefore it is possible to increase the contact area of the sidewall insulating film 20 with respect to the sidewall 5 of the substrate 2 and improve adhesive properties thereof. Additionally, the upper-surface insulating film 10, in addition to the sidewall 5 of the substrate 2, is coated with the sidewall insulating film 20 from the side of the sidewall 5 of the substrate 2. This makes it possible to effectively improve insulation properties against the outside, and makes it possible to restrain a leakage current from flowing into the side of the substrate 2 from the outside. Particularly in the present preferred embodiment, a part (the passivation film 14 in the present preferred embodiment) of the insulating layer 13 is also coated with the sidewall insulating film 20 from the side of the sidewall 5 of the substrate 2, and therefore those effects are heightened.

Additionally, in the present preferred embodiment, the plurality of concavo-convex portions 21 having a comparatively small pitch are formed on the side of the upper surface 3 of the substrate 2, whereas the plurality of concavo-convex portions 21 having a comparatively large pitch are formed on the side of the lower surface 4 of the substrate 2. The reduction in pitch of the concavo-convex portion 21 on the side of the upper surface 3 of the substrate 2 makes it possible to lessen damage inflicted onto the side of the upper surface 3 of the substrate 2 when the concavo-convex portion 21 is formed. This makes it possible to effectively restrain a crack from occurring in the upper surface 3 of the substrate 2, particularly, in a corner portion on the side of the upper surface 3 of the substrate 2. As thus described, the chip part 1 has a configuration in which film-forming properties of the sidewall insulating film 20 with respect to the sidewall 5 of the substrate 2 have been improved.

As shown in FIG. 4A and FIG. 4B, another feature of the chip part 1 according to the present embodiment resides in that a first inner-wall insulating film 30 is formed on an inner wall 17a of the first pad opening 17 and in that a second inner-wall insulating film is formed on an inner wall 19a of the second pad opening 19. The thus formed configuration makes it possible to excellently and electrically connect the first external electrode 7 and the first pad film 11 together, and makes it possible to excellently and electrically connect the second external electrode 8 and the second pad film 12 together. A detailed description will be hereinafter given of the first inner-wall insulating film 30, the second inner-wall insulating film 31, and an arrangement therearound.

As shown in FIG. 4A, the inner wall 17a of the first pad opening 17 is formed by an inner wall 14b of the passivation film 14 positioned in the first pad opening 17 and by an inner wall 15b of the resin film 15 positioned in the first pad opening 17. The inner wall 15b of the resin film 15 is formed in a curved shape that is rounded toward an inside of the first pad opening 17.

The inner wall 14b of the passivation film 14 positioned in the first pad opening 17 is placed at the outer side of the first pad opening 17 than the inner wall 15b of the resin film 15 in the first pad opening 17. Additionally, the inner wall 14b of the passivation film 14 is placed on the first pad film 11. A hollow 32 is formed in the inner wall 17a of the first pad opening 17 by the first pad film 11, the inner wall 14b of the passivation film 14, and the resin film 15.

The first inner-wall insulating film 30 includes the same insulating material as the sidewall insulating film 20, and fills the hollow 32 therewith on the first pad film 11. A surface of the first inner-wall insulating film 30 is connected to the inner wall 17a of the first pad opening 17 without differences in level, and is inclined downwardly toward the inside of the first pad opening 17. The surface of the first inner-wall insulating film 30 may be formed in a curved shape that is rounded toward the inside of the first pad opening 17. Additionally, the first inner-wall insulating film 30 may have a coating portion with which a part of the resin film 15 is coated in the first pad opening 17.

As shown in FIG. 4B, the inner wall 19a of the second pad opening 19 is formed by an inner wall 14b of the passivation film 14 positioned in the second pad opening 19 and by an inner wall 15b of the resin film 15 positioned in the second pad opening 19. The inner wall 15b of the resin film 15 is formed in a curved shape that is rounded toward an inside of the second pad opening 19.

The inner wall 14b of the passivation film 14 positioned in the second pad opening 19 is placed at the outer side of the second pad opening 19 than the inner wall 15b of the resin film 15 positioned in the second pad opening 19. Additionally, the inner wall 14b of the passivation film 14 is placed on the second pad film 12. A hollow 33 is formed by the second pad film 12, the inner wall 14b of the passivation film 14, and the resin film 15 in the inner wall 19a of the second pad opening 19.

The second inner-wall insulating film 31 includes the same insulating material as the sidewall insulating film 20, and fills the hollow 33 therewith on the second pad film 12. A surface of the second inner-wall insulating film 31 is connected to the inner wall 19a of the second pad opening 19 without differences in level, and is inclined downwardly toward the inside of the second pad opening 19. The surface of the second inner-wall insulating film 31 may be formed in a curved shape that is rounded toward the inside of the second pad opening 19. Additionally, the second inner-wall insulating film 31 may have a coating portion with which a part of the resin film 15 is coated in the second pad opening 19.

As thus described, the first inner-wall insulating film 30 connected to the inner wall 17a of the first pad opening 17 without differences in level is formed in the first pad opening 17, whereas the second inner-wall insulating film 31 connected to the inner wall 19a of the second pad opening 19 without differences in level is formed in the second pad opening 19. Moreover, the hollow 32 formed in the inner wall 17a of the first pad opening 17 is filled with the first inner-wall insulating film 30, and the hollow 33 formed in the inner wall 19a of the second pad opening 19 is filled with the second inner-wall insulating film 31.

This makes it possible to excellently embed the first external electrode 7 in the first pad opening 17, and makes it possible to excellently embed the second external electrode 8 in the second pad opening 19. As a result, it is possible to excellently and electrically connect the first external electrode 7 and the first pad film 11 together, and it is possible to excellently and electrically connect the second external electrode 8 and the second pad film 12 together.

As described above, according to the present preferred embodiment, it is possible to provide the chip part 1 that is capable of excellently protecting the functional element 9 by the sidewall insulating film 20 formed on the sidewall 5 of the substrate 2. Additionally, it is possible to provide the chip part 1 that is capable of excellently and electrically connecting the first external electrode 7 and the first pad film 11 together and that is capable of excellently and electrically connecting the second external electrode 8 and the second pad film 12 together.

Method for Manufacturing the Chip Part 1

Next, a method for manufacturing the chip part will be described. FIG. 5A to FIG. 5H are cross-sectional views, each showing the method for manufacturing the chip part 1. FIG. 6A to FIG. 6H are enlarged-views corresponding to FIG. 3, each showing the method for manufacturing the chip part 1. FIG. 7A to FIG. 7H are enlarged-views corresponding to FIG. 4A, each showing the method for manufacturing the chip part 1.

Figure 5A:
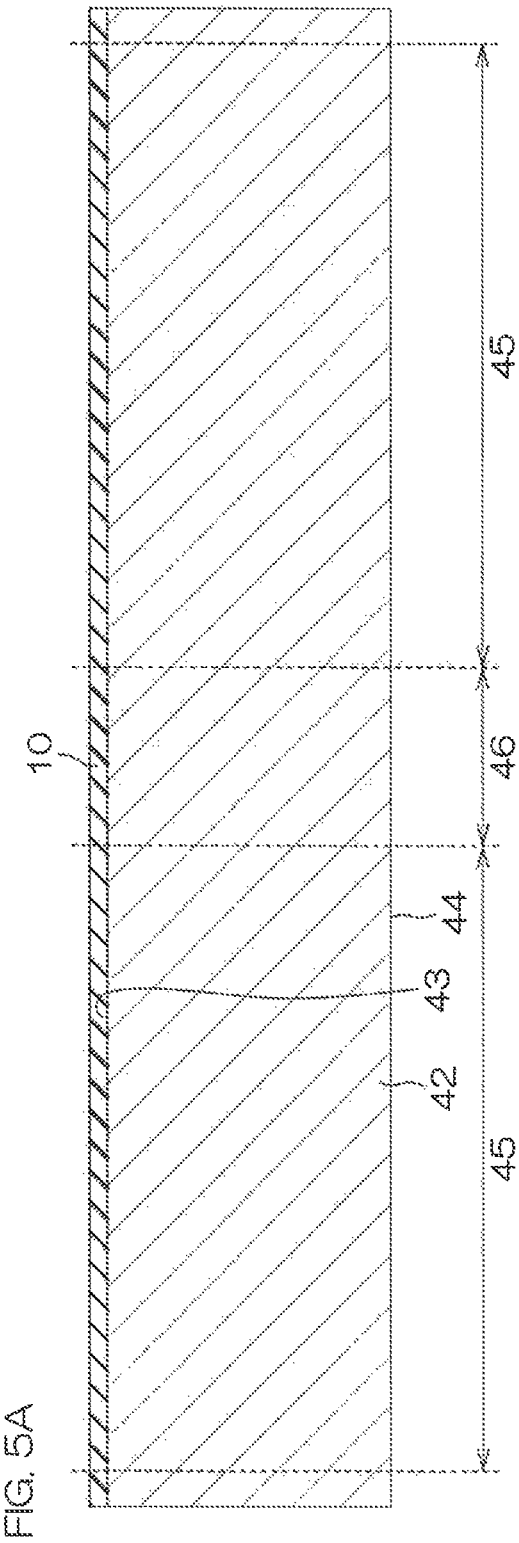
FIG. 5A is a cross-sectional view showing a method for manufacturing a chip part shown in FIG. 1.

As shown in FIG. 5A, FIG. 6A, and FIG. 7A, a base substrate 42 that has an upper surface 43 and a lower surface 44 is prepared. The upper surface 43 of the base substrate 42 corresponds to the upper surface 3 of the substrate 2, and the lower surface 44 of the base substrate 42 corresponds to the lower surface 4 of the substrate 2. A plurality of chip-part forming regions 45 in each of which the chip part 1 is formed and a boundary region 46 by which the chip-part forming regions 45 are partitioned are set to the upper surface 43 of the base substrate 42. Predetermined processing is applied to the base substrate 42, and then the base substrate 42 is cut along the boundary region 46, and, as a result, a plurality of individual pieces including the chip-part forming regions 45 are cut out as the chip parts 1 from the base substrate 42.

First, the upper-surface insulating film 10 is formed on the upper surface 43 of the base substrate 42 after the base substrate 42 is prepared. The upper-surface insulating film 10 may be formed by oxidizing the upper surface 43 of the base substrate 42 according to thermal oxidation treatment, or may be formed by depositing an insulating material on the upper surface 43 of the base substrate 42 according to a CVD method.

Figure 6D:
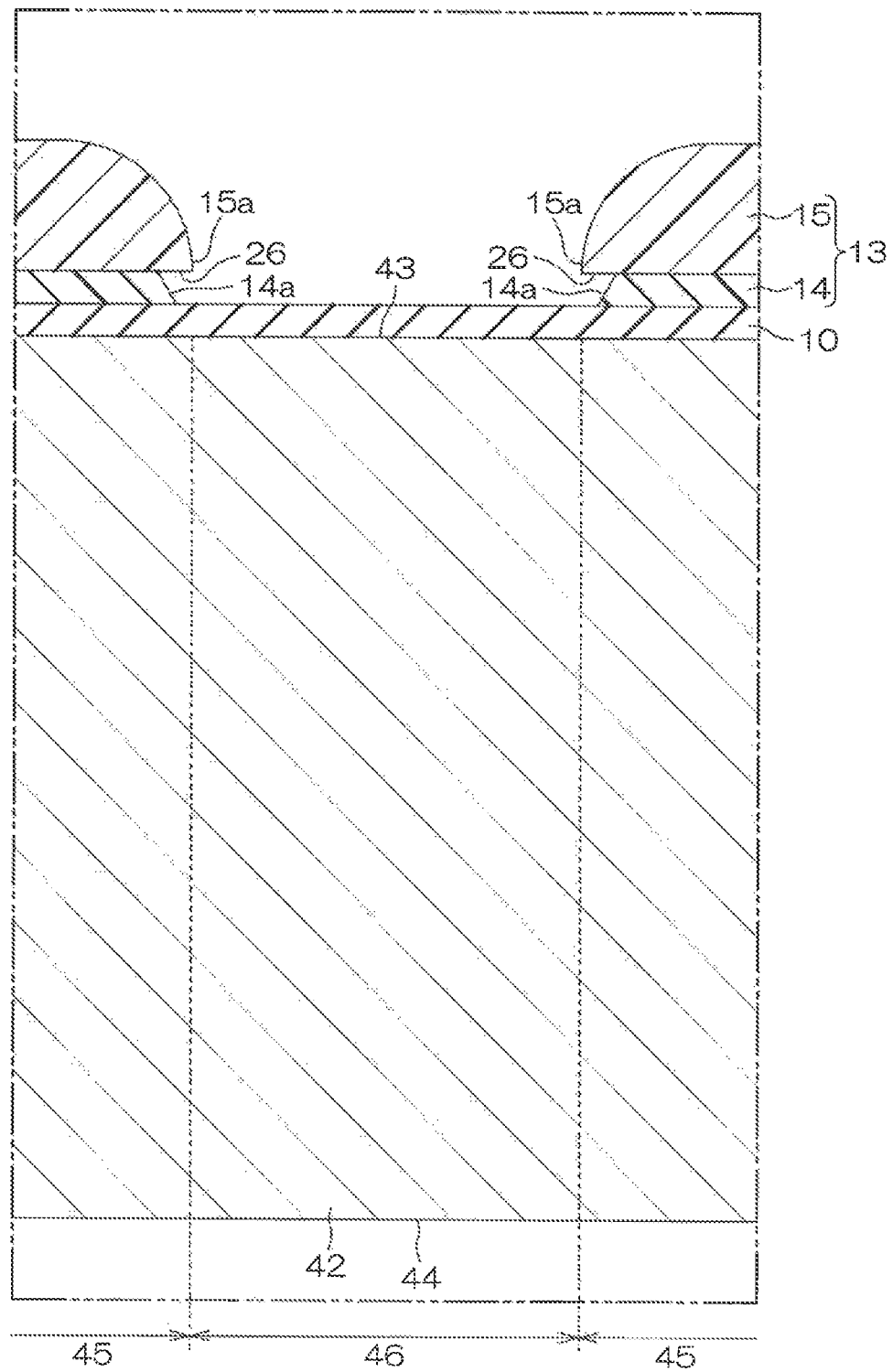
FIG. 6D is a cross-sectional view showing a step subsequent to that of FIG. 6C.
Figure 7B:
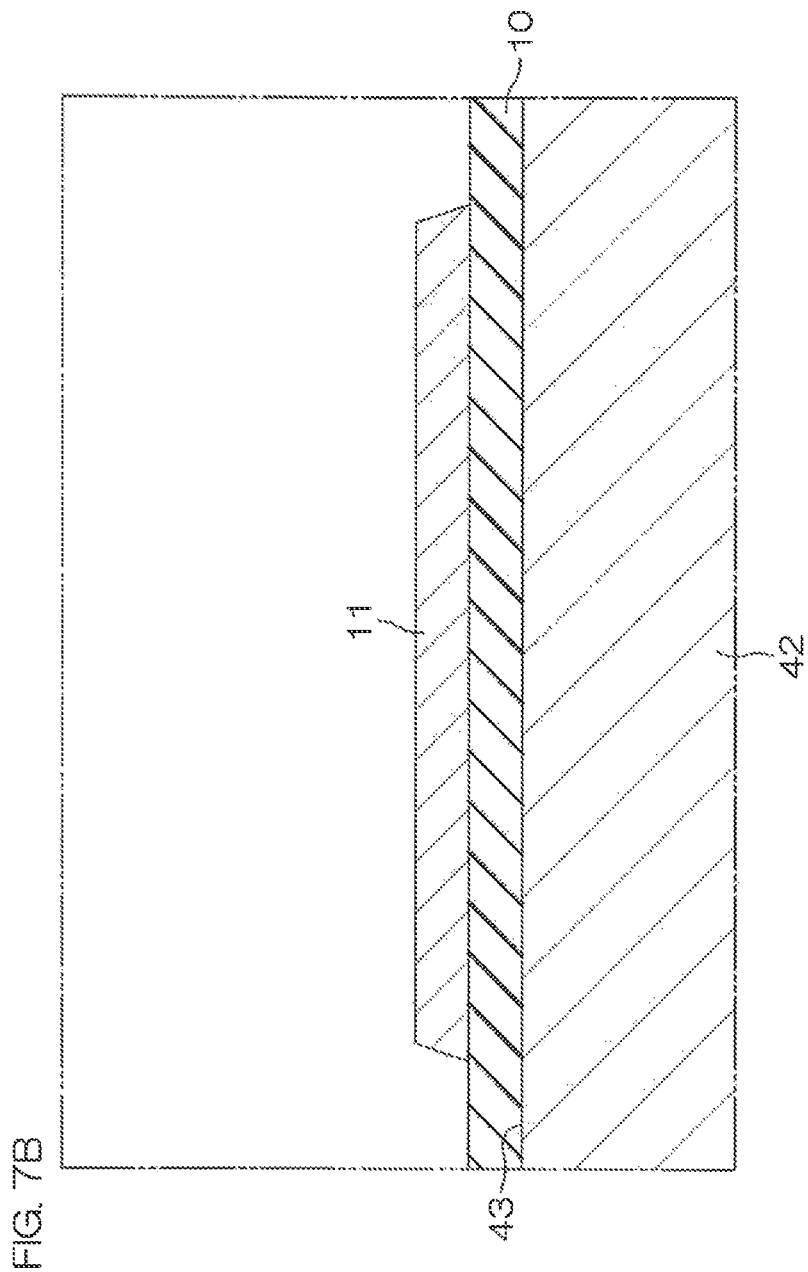
FIG. 7B is a cross-sectional view showing a step subsequent to that of FIG. 7A.

Thereafter, as shown in FIG. 5B, FIG. 6B, and FIG. 7B, a conductor film is formed on the upper-surface insulating film 10, and patterning process is performed to have a predetermined shape. As a result, the first pad film 11 and the second pad film 12 are formed. Additionally, the functional element 9 is also formed by using a part of this process.

Figure 5C:
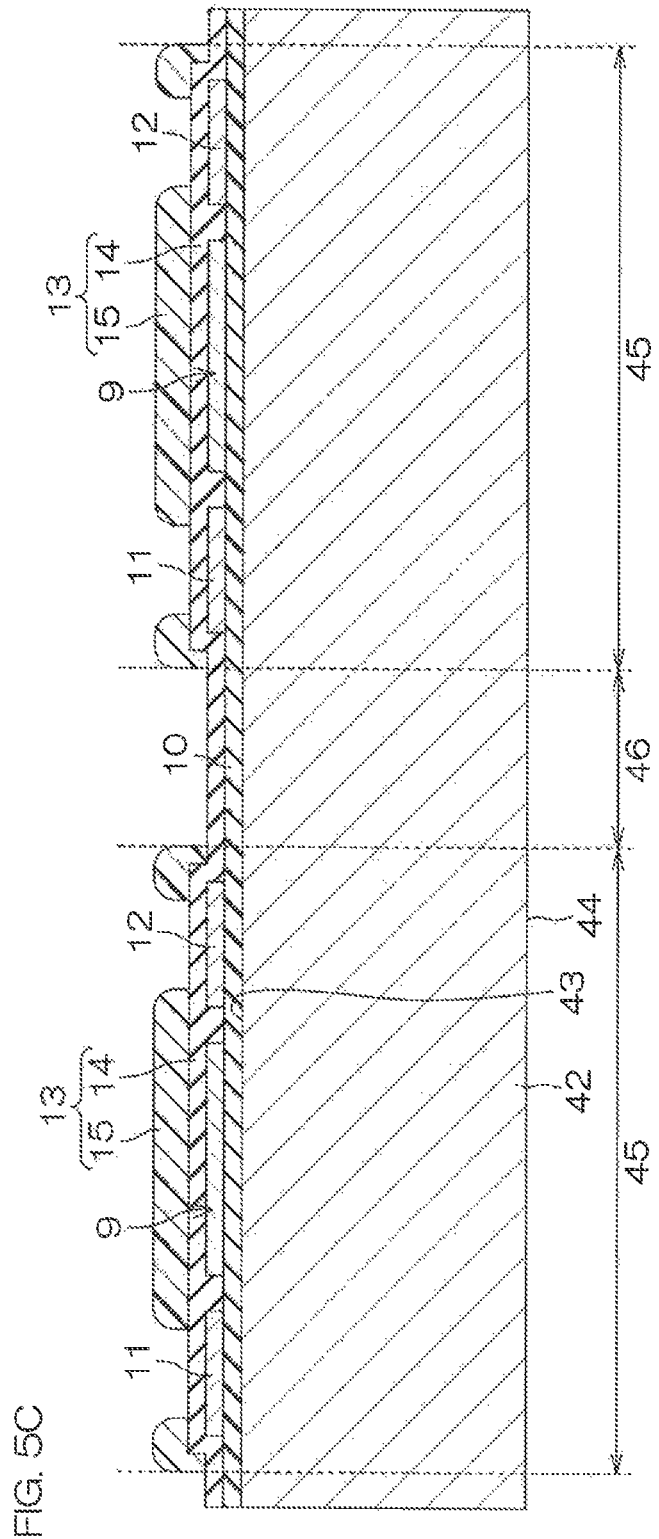
FIG. 5C is a cross-sectional view showing a step subsequent to that of FIG. 5B.
Figure 7C:
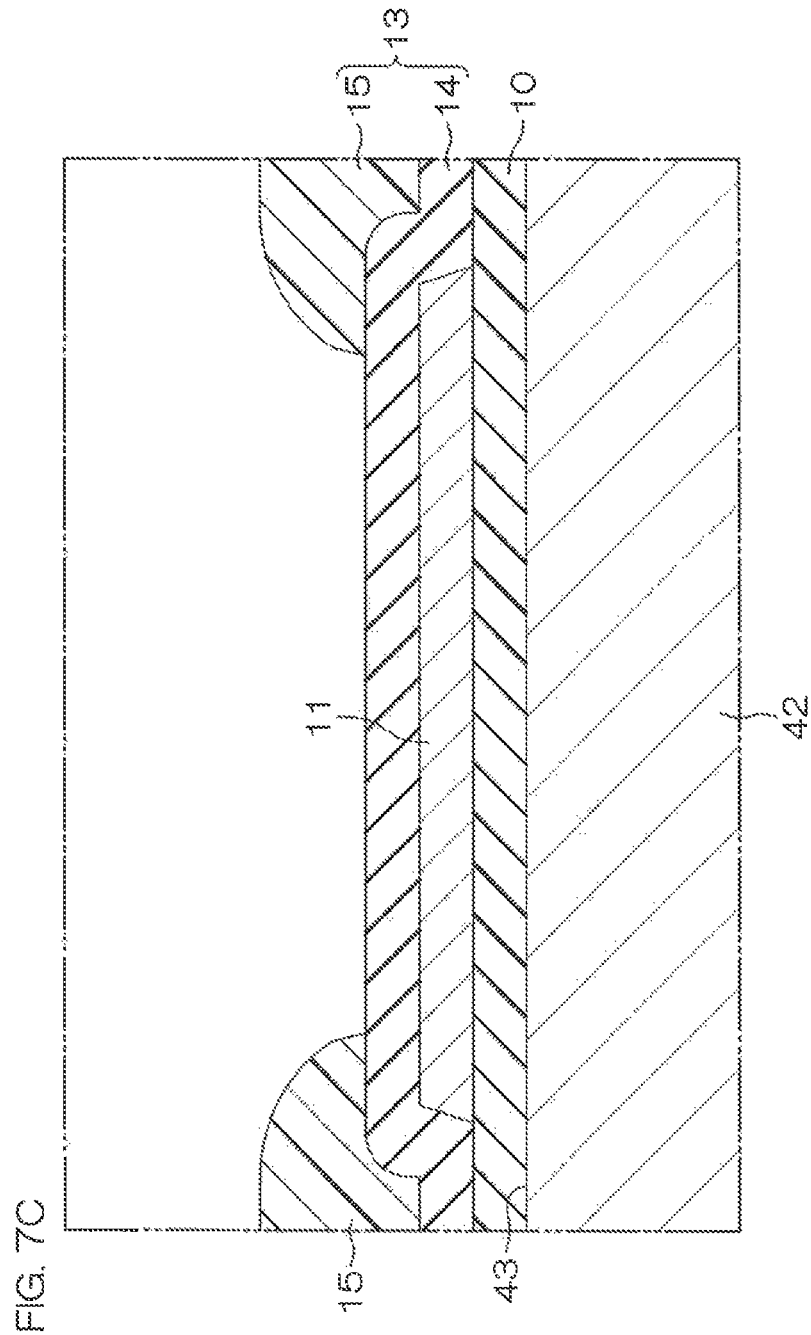
FIG. 7C is a cross-sectional view showing a step subsequent to that of FIG. 7B.

Thereafter, as shown in FIG. 5C, FIG. 6C, and FIG. 7C, SiN is deposited according to, for example, a CVD method, and the passivation film 14 with which the functional element 9, the first pad film 11, and the second pad film 12 are coated is formed. Thereafter, photosensitive polyimide is applied so as to coat the passivation film 14 therewith, and the resin film 15 is formed. As a result, the insulating layer 13 including the passivation film 14 and the resin film 15 is formed. Thereafter, the resin film 15 is exposed and developed by patterns corresponding to the boundary region 46 set between the chip-part forming regions 45, the first pad opening 17, and the second pad opening 19.

Figure 5D:
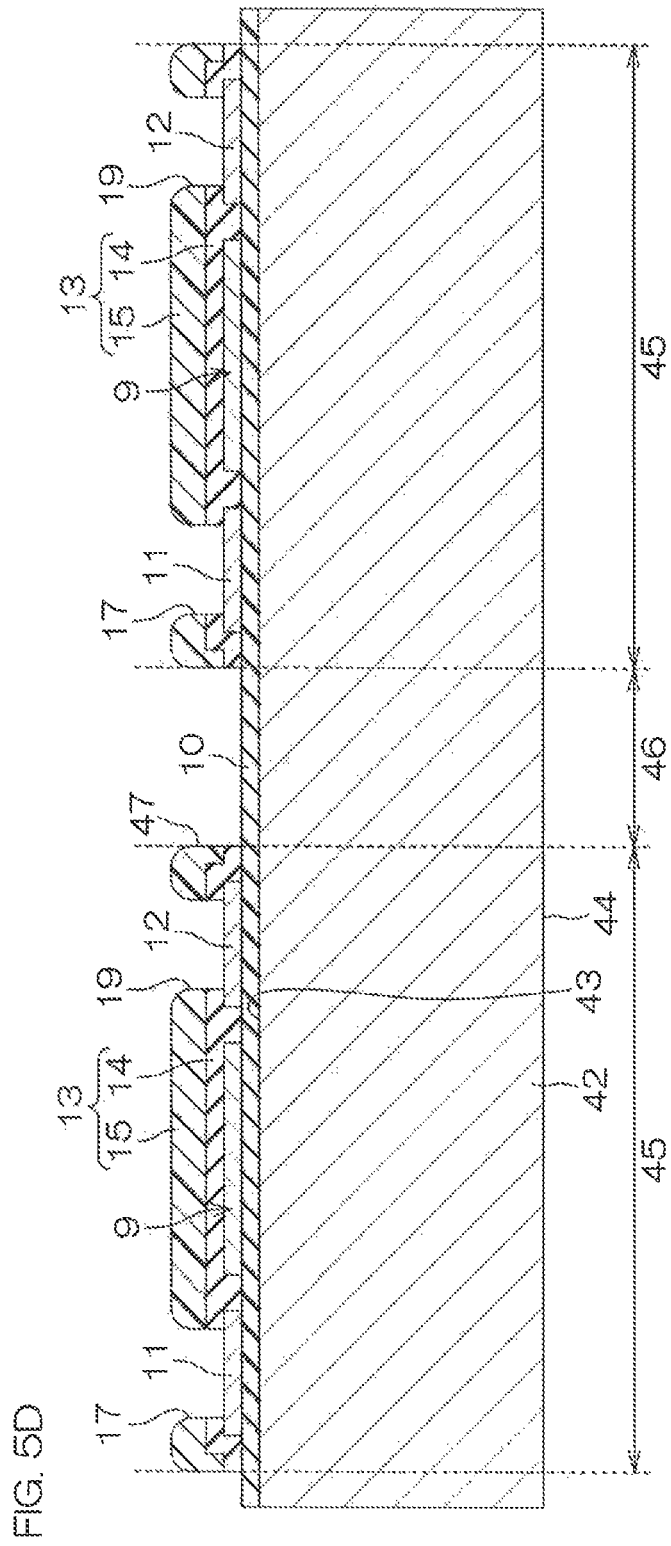
FIG. 5D is a cross-sectional view showing a step subsequent to that of FIG. 5C.

Thereafter, as shown in FIG. 5D, FIG. 6D, and FIG. 7D, the passivation film 14 is etched while using the resin film 15 as a mask, the first pad opening 17, the second pad opening 19 and an opening 47 by which the boundary region 46 is exposed are formed.

In this step, as shown in FIG. 6D, the sidewall 14a of the passivation film 14 exposed from the boundary region 46 is formed at an inner region side of the chip-part forming region 45 than the sidewall 15a of the resin film 15 exposed to the boundary region 46 by over-etching. As a result, the hollow 26 is defined by the upper-surface insulating film 10, the sidewall 14a of the passivation film 14, and the resin film 15.

Additionally, in this step, as shown in FIG. 7D, the inner wall 14b of the passivation film 14 positioned in the first pad opening 17 is formed at an outer side of the first pad opening 17 than the inner wall 15b of the resin film 15 positioned in the first pad opening 17 by over-etching. As a result, the hollow 32 in the inner wall 17a of the first pad opening 17 is defined by the first pad film 11, the inner wall 14b of the passivation film 14, and the resin film 15 (see FIG. 4A also).

Additionally, the inner wall 14b of the passivation film 14 positioned in the second pad opening 19 is formed at an outer side of the second pad opening 19 than the inner wall 15b of the resin film 15 positioned in the second pad opening 19 by over-etching. As a result, the hollow 33 in the inner wall 19a of the second pad opening 19 is defined by the second pad film 12, the inner wall 14b of the passivation film 14, and the resin film 15 (see FIG. 4B also).

Figure 6E:
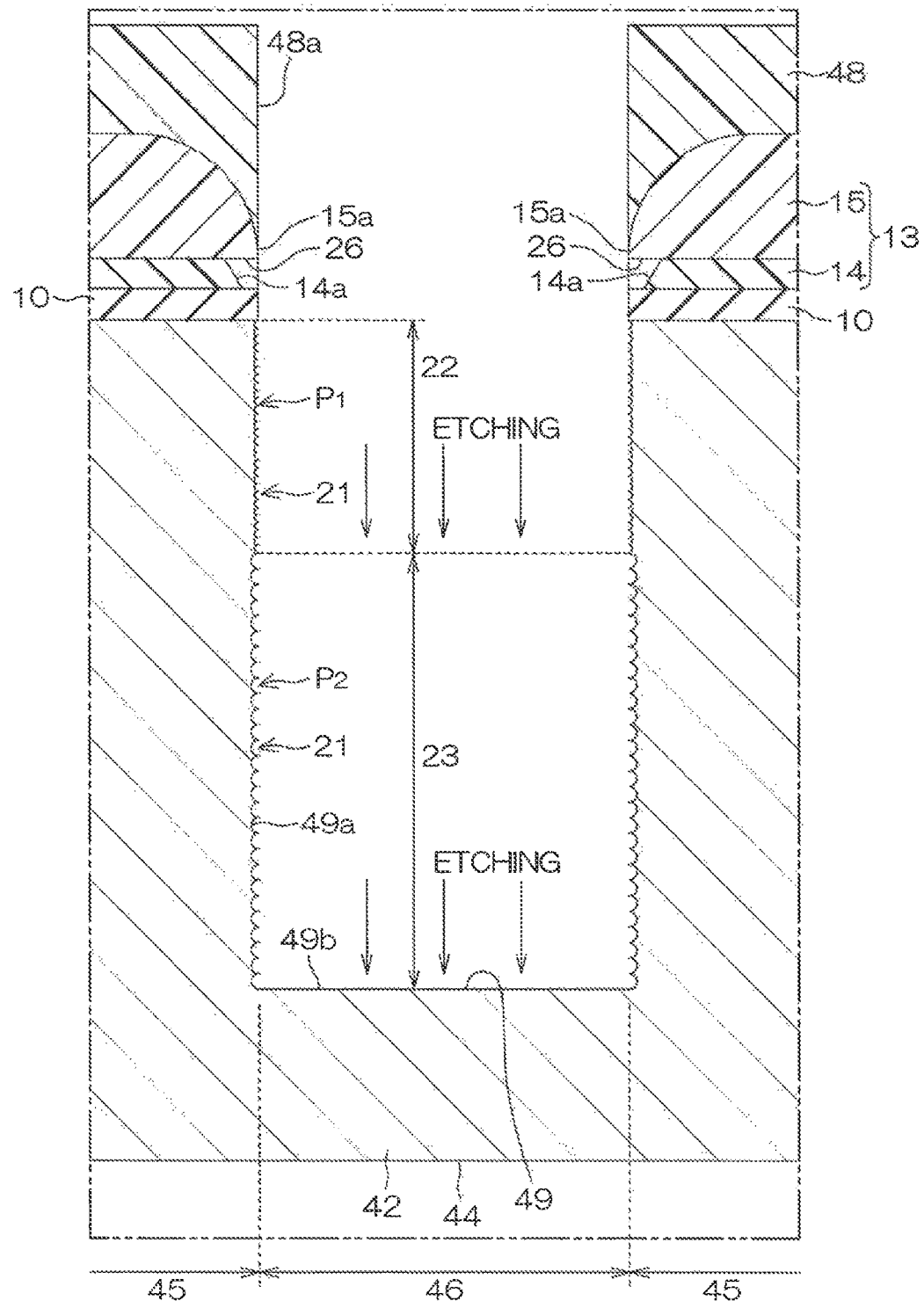
FIG. 6E is a cross-sectional view showing a step subsequent to that of FIG. 6D.
Figure 7E:
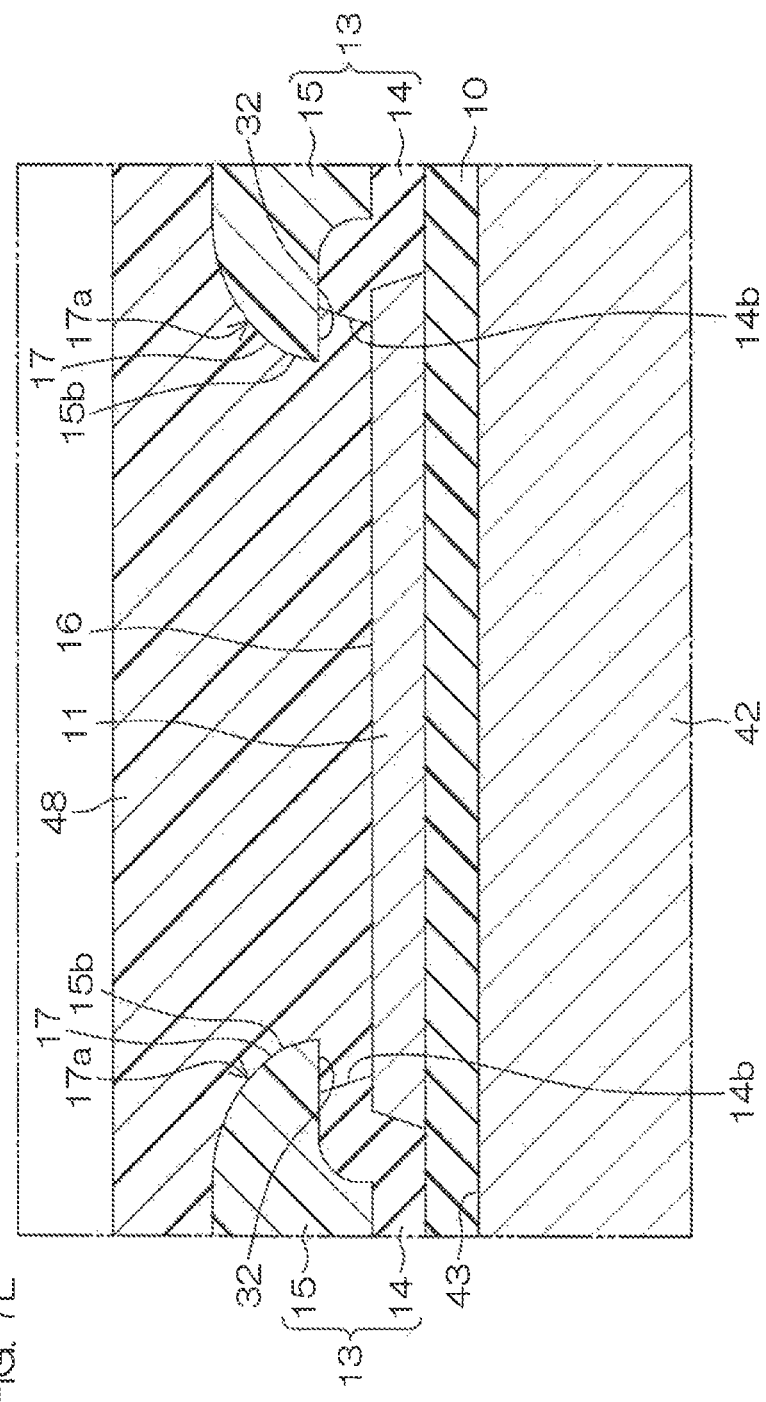
FIG. 7E is a cross-sectional view showing a step subsequent to that of FIG. 7D.

Thereafter, as shown in FIG. 5E, FIG. 6E, and FIG. 7E, a resist mask 48 with which the chip-part forming region 45 is coated and that selectively has an opening 48a by which the boundary region 46 is exposed is formed on the base substrate 42. Thereafter, a surface layer part of the base substrate 42 is partially removed along the peripheral edge of the chip-part forming region 45 according to, for example, anisotropic etching via the resist mask 48 (such as an RIE (Reactive Ion Etching) method). As a result, a groove 49 that partitions the chip-part forming regions 45 is formed in the base substrate 42. The groove 49 includes a sidewall 49a and a bottom wall 49b.

The step of forming the groove 49 includes a step of removing a needless part of the base substrate 42 while forming a plurality of concavo-convex portions 21 on the sidewall 49a of the groove 49 from a side of the upper surface 43 toward a side of the lower surface 44 of the base substrate 42 according to, for example, a deep etching method called a Bosch process as shown in FIG. 6E. In more detail, in this process, the step of removing a part of the base substrate 42 and the step of forming an insulating protective film on the inner wall having an already-etched part of the base substrate 42 are alternately performed according to anisotropic etching (for example, the RIE method). As a result, the plurality of concavo-convex portions 21 are formed on the sidewall 49a of the groove 49.

In the step of forming the groove 49, the plurality of concavo-convex portions 21 are formed with different pitches from the side of the upper surface 43 toward the side of the lower surface 44 of the base substrate 42. In more detail, a plurality of concavo-convex portions 21 having a comparatively small pitch are formed on the side of the upper surface 43 of the base substrate 42, whereas the plurality of concavo-convex portions 21 having a comparatively large pitch are formed on the side of the lower surface 44 of the base substrate 42.

FIG. 6E shows an example in which the first concavo-convex-portion forming region 22 including the plurality of concavo-convex portions 21 having the first pitch $P_1$ is formed in a region closer to the upper surface of the base substrate 42 and in which the second concavo-convex-portion forming region 23 including the plurality of concavo-convex portions 21 having the second pitch $P_2$ larger than the first pitch $P_1$ is formed in a region closer to the lower surface 44 of the base substrate 42. The plurality of concavo-convex portions 21 may be formed on the sidewall 49a of the groove 49 so that the pitch gradually increases from the side of the upper surface 43 toward the side of the lower surface 44 of the base substrate 42.

As thus described, the reduction in pitch of the concavo-convex portion 21 on the side of the upper surface 43 of the base substrate 42 makes it possible to lessen damage inflicted onto the side of the upper surface 43 of the base substrate 42 when the groove 49 is formed. This makes it possible to effectively restrain a crack from occurring at the upper surface 43 of the base substrate 42, particularly, at an opening end of the groove 49 (i.e., a portion corresponding to the corner portion on the side of the upper surface 3 of the substrate 2). Therefore, it becomes possible to improve film-forming properties of a sidewall insulating film 53 (sidewall insulating film 20) formed so as to coat the sidewall 49a of the groove 49 therewith in a subsequent step. On the other hand, the increase in pitch of the concavo-convex portion 21 on the side of the lower surface 44 of the base substrate 42 makes it possible to increase the forming speed of the groove 49. The groove 49 of the base substrate 42 is formed, and then the resist mask 48 is removed.

Figure 5F:
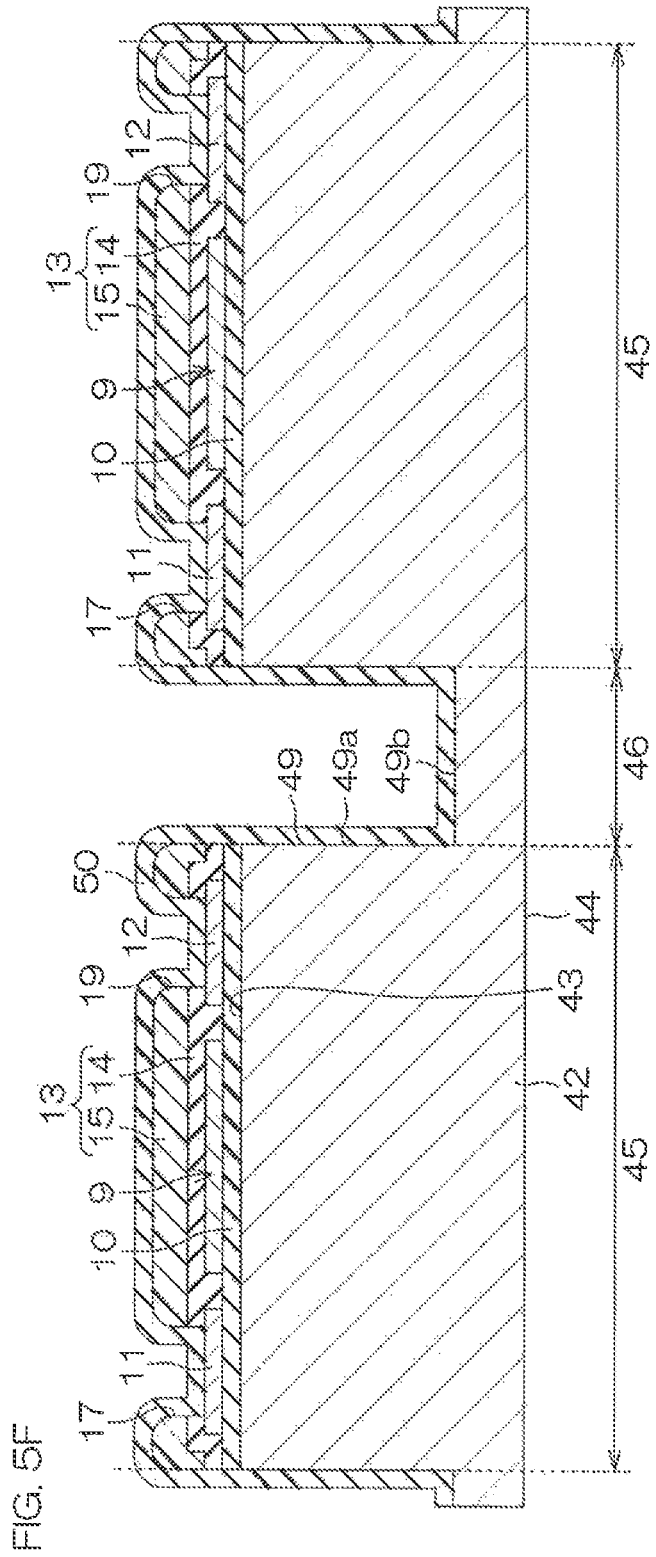
FIG. 5F is a cross-sectional view showing a step subsequent to that of FIG. 5E.
Figure 6F:
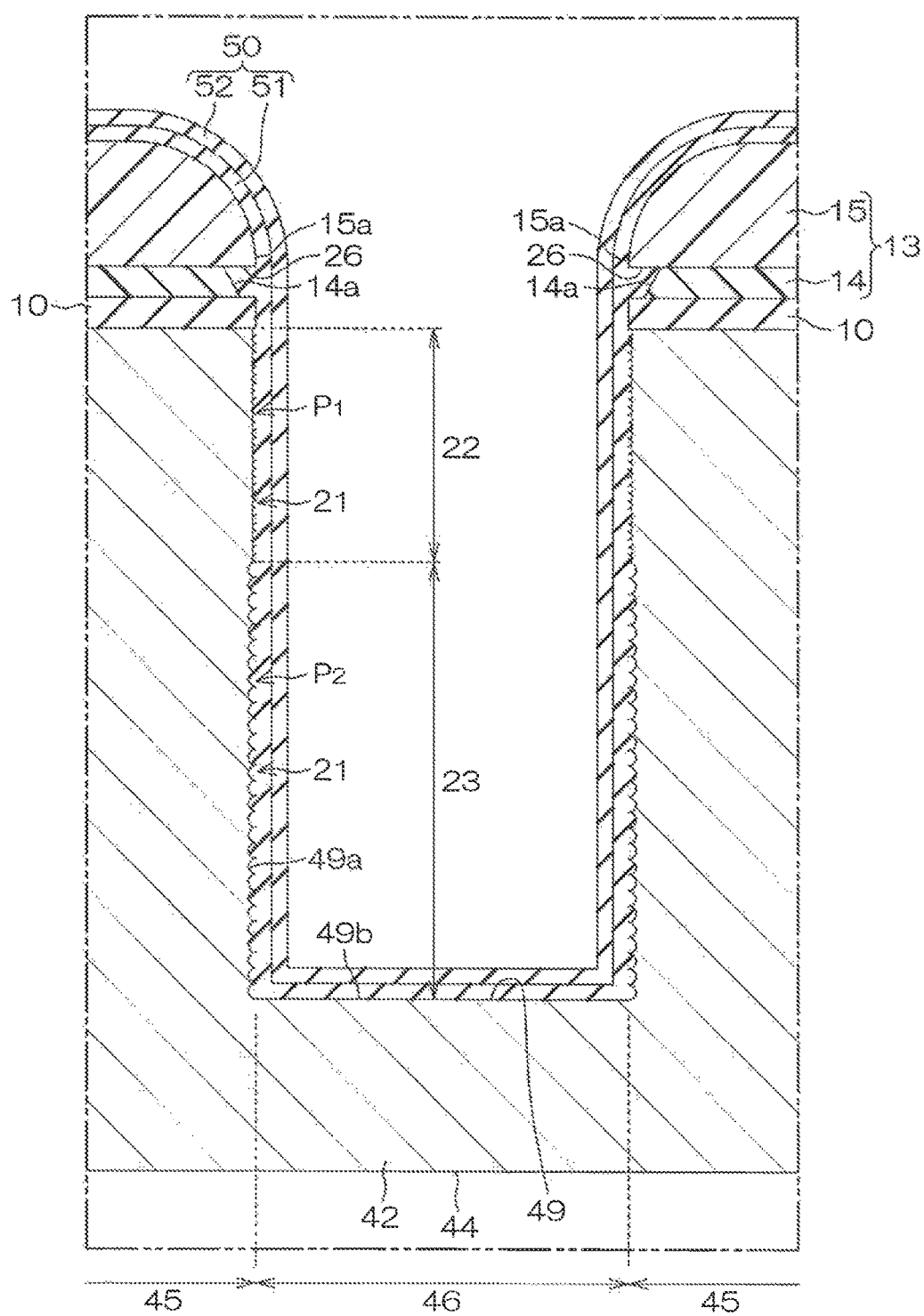
FIG. 6F is a cross-sectional view showing a step subsequent to that of FIG. 6E.
Figure 7F:
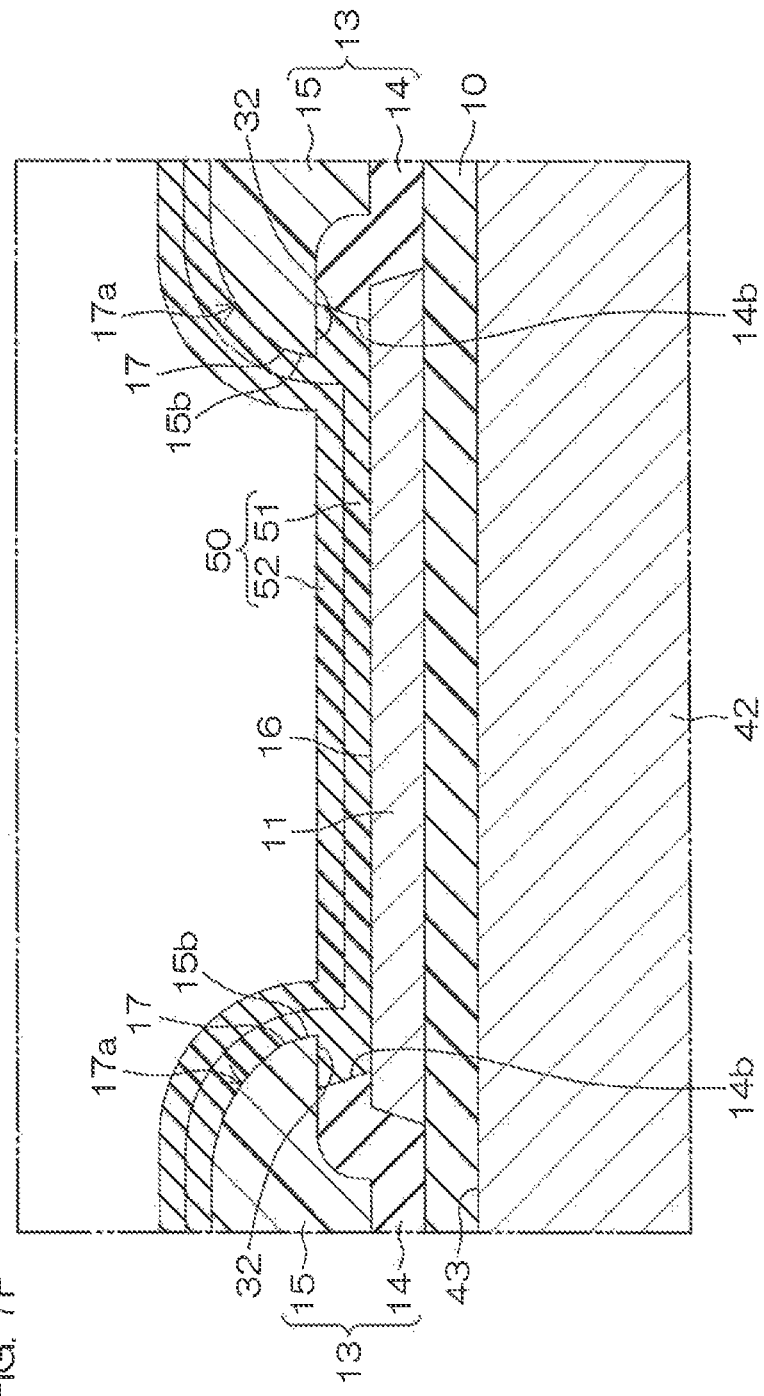
FIG. 7F is a cross-sectional view showing a step subsequent to that of FIG. 7E.

Thereafter, as shown in FIG. 5F, FIG. 6F, and FIG. 7F, $SiO_2$ is deposited so as to coat the whole region of the chip-part forming region 45 therewith, in addition to the inner wall of the groove 49, according to, for example, a CVD method, and an insulating film 50 is formed. As shown in FIG. 6F and FIG. 7F, the step of forming the insulating film is performed twice in the present preferred embodiment, and the insulating film 50 consisting of the laminated film that includes the first insulating film 51 and the second insulating film 52 in this order from the side of the base substrate 42 is formed. The step of forming the insulating film may be performed only once, or may be performed twice or more.

As shown in FIG. 6F, in this step, the insulating film 50 is formed so as to enter the hollow 26 defined by the upper-surface insulating film 10, the sidewall 14a of the passivation film 14, and the sidewall 15a of the resin film 15. Additionally, as shown in FIG. 7F, in this step, the insulating film 50 is formed so as to enter the hollow 32 defined by the inner wall 17a of the first pad opening 17. Still additionally, in this step, the insulating film 50 is formed so as to enter the hollow 33 defined by the inner wall 19a of the second pad opening 19.

Figure 5G:
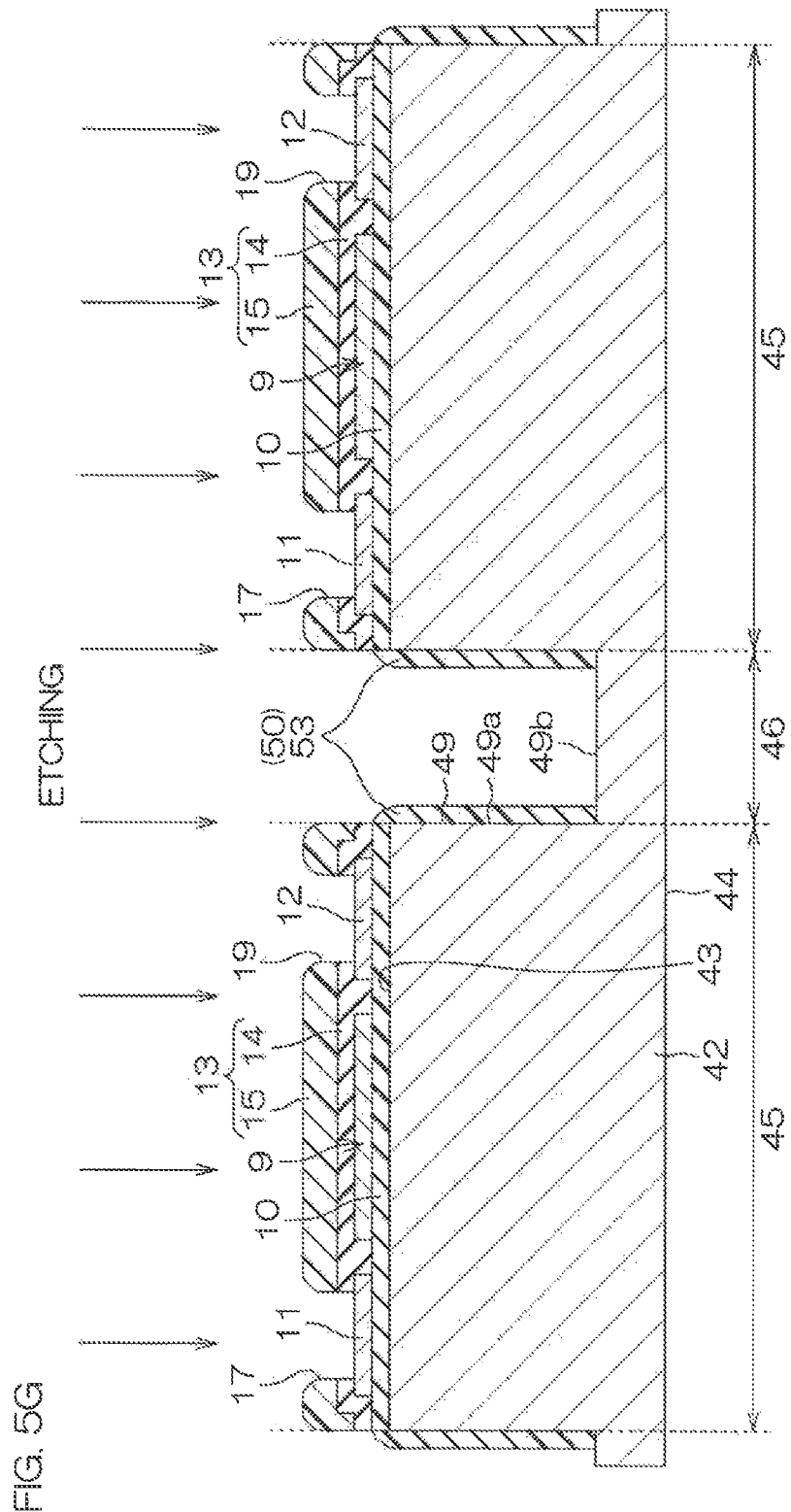
FIG. 5G is a cross-sectional view showing a step subsequent to that of FIG. 5F.
Figure 6G:
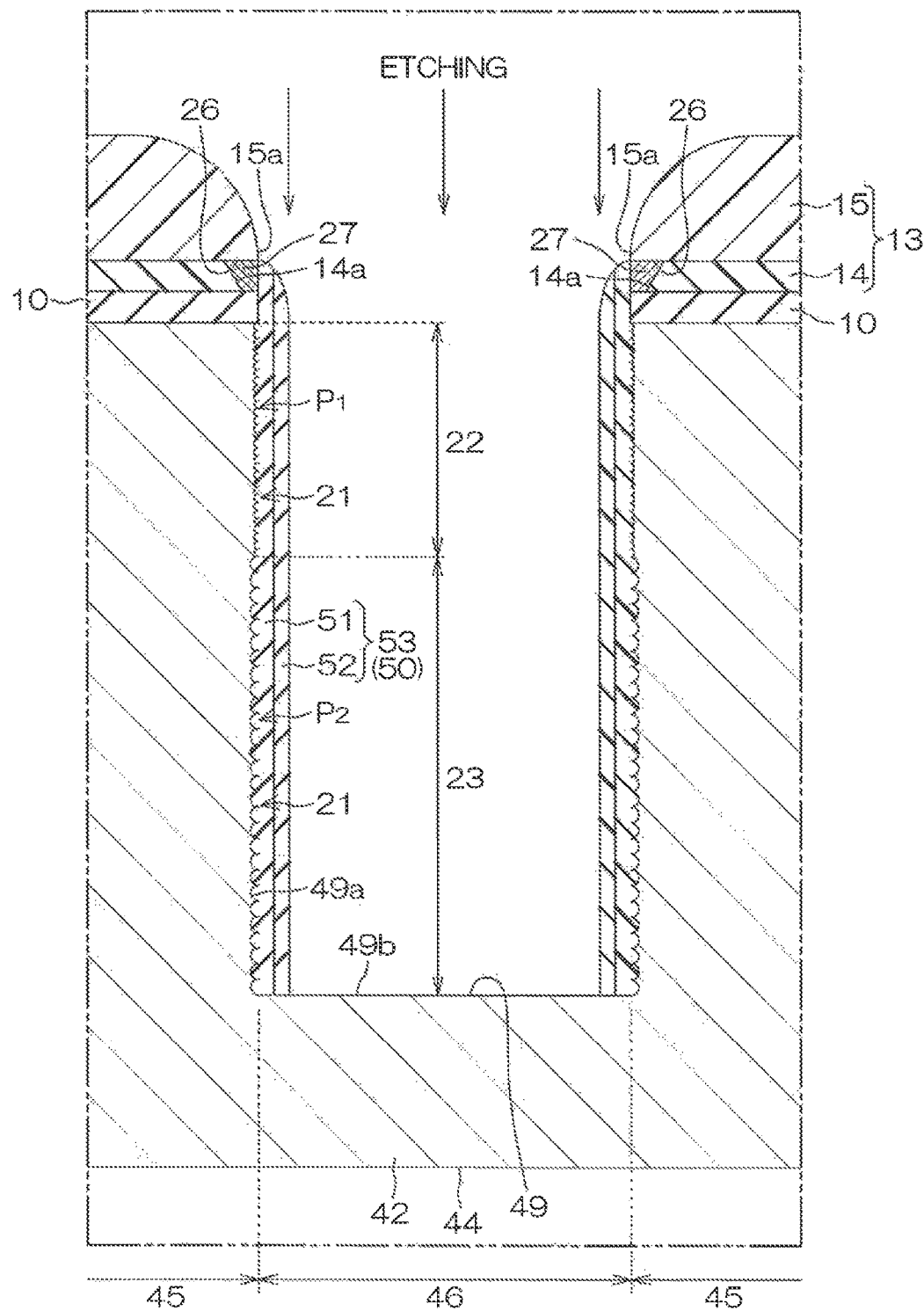
FIG. 6G is a cross-sectional view showing a step subsequent to that of FIG. 6F.

Thereafter, as shown in FIG. 5G, FIG. 6G, and FIG. 7G, according to, for example, anisotropic etching (e.g., RIE method), parts of the insulating film 50 that are parallel to the upper surface 43 of the base substrate 42 are selectively removed so as to leave a part of the insulating film 50 with which the sidewall 49a of the groove 49 is coated. As a result, the sidewall insulating film 53 with which the sidewall 49a of the groove 49 is coated is formed in a self-aligned manner with respect to the chip-part forming region 45 (in more detail, the resin film 15).

Additionally, in this step, as shown in FIG. 6G, a part of the insulating film 50 remains in the hollow 26 defined by the upper-surface insulating film 10, by the sidewall 14a of the passivation film 14, and by the sidewall 15a of the resin film 15, and the peripheral-edge insulating film 27 is formed (see FIG. 3 also). Still additionally, in this step, as shown in FIG. 7G, a part of the insulating film 50 remains in the hollow 32 defined by the inner wall 17a of the first pad opening 17, and the first inner-wall insulating film 30 is formed (see FIG. 4A also). Still additionally, in this step, a part of the insulating film 50 remains in the hollow 33 defined by the inner wall 19a of the second pad opening 19, and the second inner-wall insulating film 31 is formed (see FIG. 4B also).

Figure 7H:
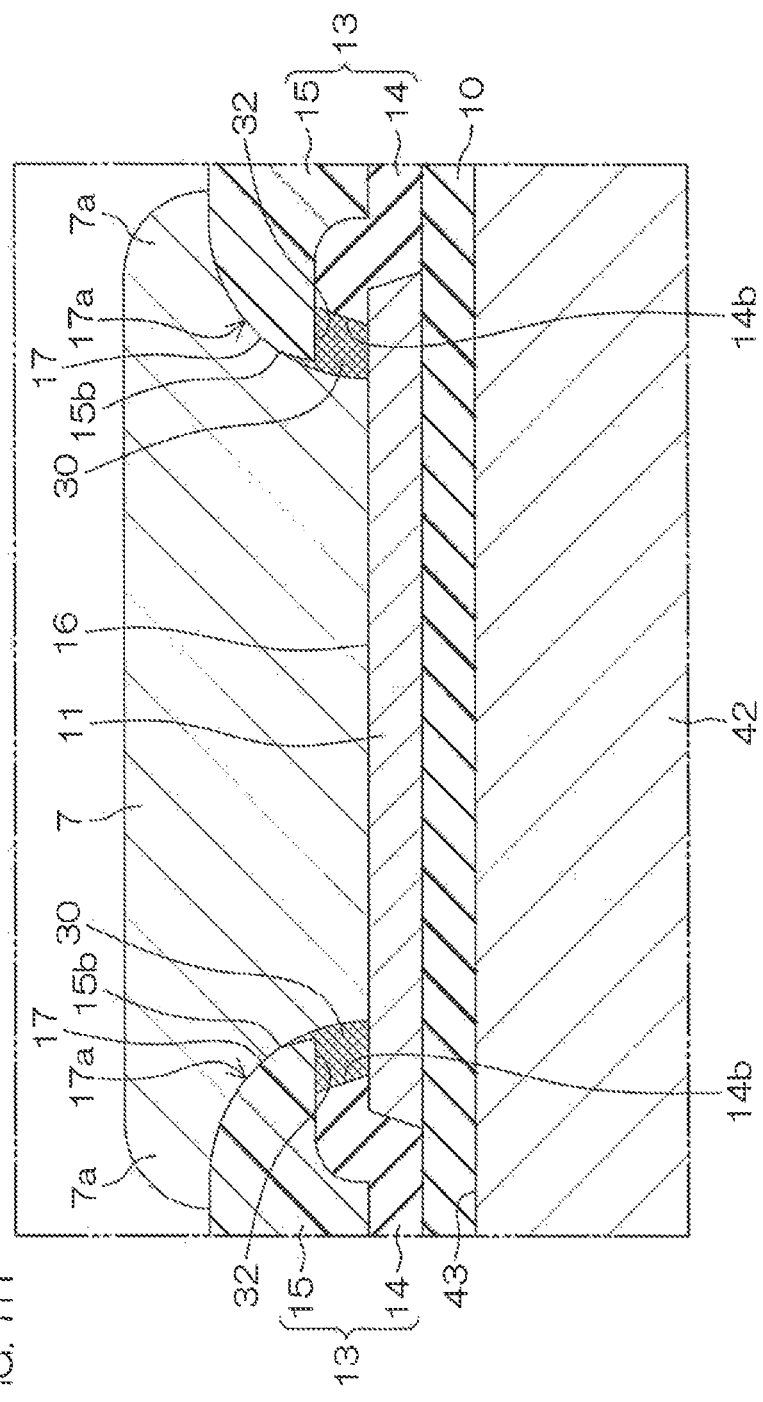
FIG. 7H is a cross-sectional view showing a step subsequent to that of FIG. 7G.

Thereafter, as shown in FIG. 5H, FIG. 6H, and FIG. 7H, an Ni film, a Pd film, and an Au film are formed in this order on the first pad film 11 exposed from the first pad opening 17 and on the second pad film 12 exposed from the second pad opening 19 according to, for example, plating processing. As a result, the first external electrode 7 and the second external electrode 8 each of which consists of an Ni/Pd/Au laminated film are formed.

Thereafter, the base substrate 42 is ground from a side of the lower surface 44 until it leads to the groove 49, and the plurality of chip parts 1 are cut out into individual pieces. The chip part 1 is manufactured through these steps.

As described above, according to the method for manufacturing the chip part 1, the plurality of concavo-convex portions 21 are formed on the sidewall 49a of the groove 49 in the step of forming the groove 49 (see FIG. 5E, FIG. 6E, and FIG. 7E). Therefore, it is possible to improve film-forming properties (contact area and adhesive properties) of the sidewall insulating film 53 with respect to the sidewall 49a of the groove 49 in the step of forming the sidewall insulating film 53 (see FIG. 5G, FIG. 6G, and FIG. 7G). This makes it possible to excellently form the sidewall insulating film 53 on the sidewall 49a of the groove 49.

Additionally, the sidewall insulating film 53 with which the sidewall 49a of the groove 49 is coated is formed in the self-aligned manner with respect to the chip-part forming region 45 (in more detail, the resin film 15). Additionally, the sidewall insulating film 53 undergoes the segmentation step (see FIG. 5H, FIG. 6H, and FIG. 7H), and hence becomes the sidewall insulating film 20 with which the sidewall 5 of the substrate 2 is coated in the chip part 1. Therefore, it is possible to provide the method for manufacturing the chip part 1 that is capable of easily and excellently forming the sidewall insulating film 20 on the sidewall 5 of the substrate 2. Additionally, it is possible to provide the method for manufacturing the chip part 1 that is capable of excellently protecting the functional element 9 by the sidewall insulating film 20 formed on the sidewall 5 of the substrate 2.

Additionally, in the step of forming the sidewall insulating film 53 (see FIG. 5G, FIG. 6G, and FIG. 7G), the first inner-wall insulating film 30 is formed in the hollow 32 defined by the inner wall 17a of the first pad opening 17 so as to be connected to the inner wall 17a of the first pad opening 17 without differences in level. Additionally, the second inner-wall insulating film 31 is formed in the hollow 33 defined by the inner wall 19a of the second pad opening 19 so as to be connected to the inner wall 19a of the second pad opening 19 without differences in level.

This makes it possible to excellently embed the first external electrode 7 in the first pad opening 17, and makes it possible to excellently embed the second external electrode 8 in the second pad opening 19. As a result, it is possible to provide the method for manufacturing the chip part 1 that is capable of excellently and electrically connecting the first external electrode 7 and the first pad film 11 together and that is capable of excellently and electrically connecting the second external electrode 8 and the second pad film 12 together.

Second Preferred Embodiment

Figure 9:
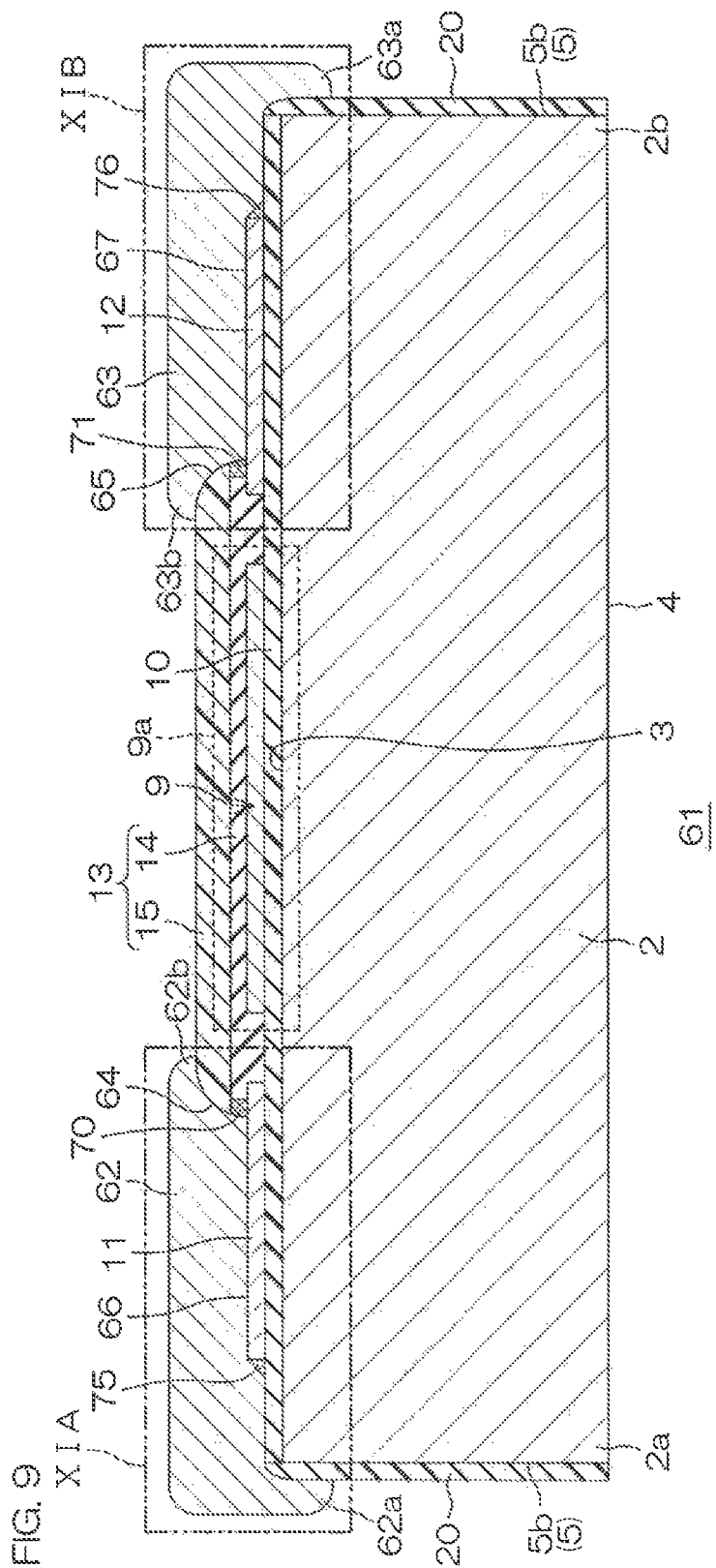
FIG. 9 is a longitudinal sectional view along line IX-IX shown in FIG. 8.
Figure 10:
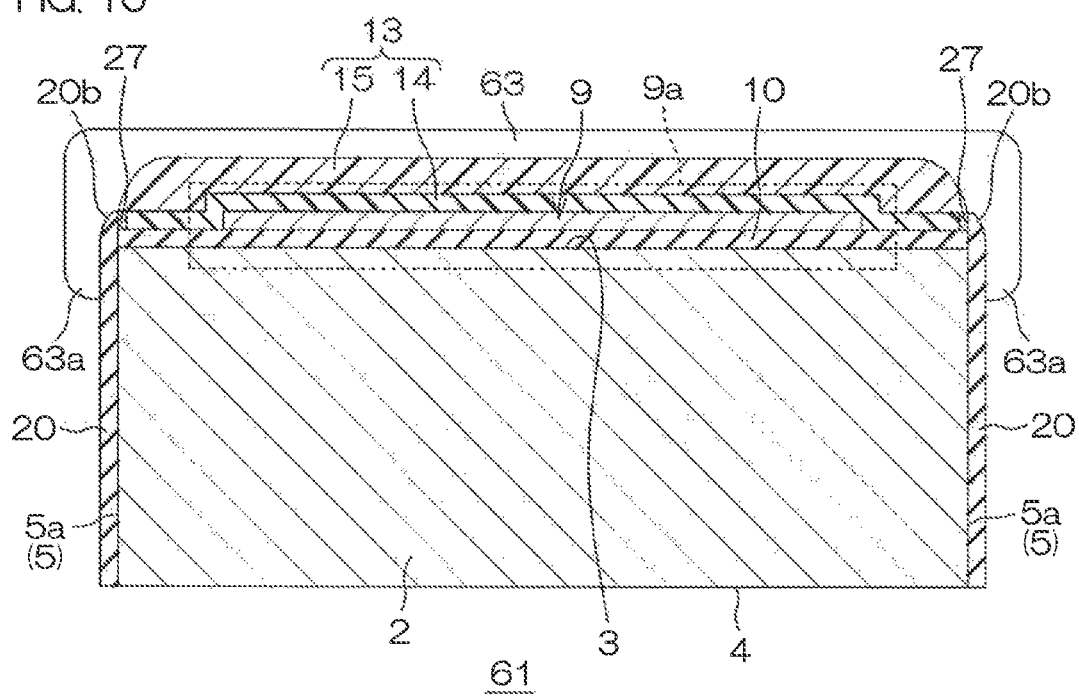
FIG. 10 is a longitudinal sectional view along line X-X shown in FIG. 8.

FIG. 8 is a perspective view of a chip part 61 according to a second preferred embodiment of the present invention. FIG. 9 is a longitudinal sectional view along line IX-IX shown in FIG. 8. FIG. 10 is a longitudinal sectional view along line X-X shown in FIG. 8.

The chip part 61 according to the second preferred embodiment is manufactured by changing the mask layout of the resin film 15 to form the first pad opening and the second pad opening 19 in the method for manufacturing the chip part 1 according to the first preferred embodiment mentioned above (the steps of FIG. 5D, FIG. 6D, and FIG. 7D). In FIG. 8 to FIG. 10, the same reference sign is given to the same component as each component described in the first preferred embodiment mentioned above, and a description of this component is omitted.

As shown in FIG. 8 to FIG. 10, in the present preferred embodiment, a first external electrode 62 and a second external electrode 63 are arranged at the upper surface 3 of the substrate 2. The first external electrode 62 is arranged at the side of one end portion 2a of the substrate 2. The second external electrode 63 is arranged at the side of other end portion 2b of the substrate 2. The first external electrode 62 and the second external electrode 63 are each formed in a rectangular shape in the plan view along the lateral sidewall 5b of the substrate 2.

A peripheral edge of the first external electrode 62 is formed along the sidewall 5 of the substrate 2. The first external electrode 62 has a coating portion 62a that extends around the longitudinal sidewall 5a and around the lateral sidewall 5b from above the upper surface 3 of the substrate 2 and with which the three sidewalls 5 of the substrate 2 are coated. Likewise, a peripheral edge of the second external electrode 63 is formed along the sidewall 5 of the substrate 2. The second external electrode 63 has a coating portion 63a that extends around the longitudinal sidewall 5a and around the lateral sidewall 5b from above the upper surface 3 of the substrate 2 and with which the three sidewalls 5 of the substrate 2 are coated.

As shown in FIG. 9 and FIG. 10, the insulating layer 13 (the passivation film 14 and the resin film 15) is formed on the upper-surface insulating film 10. A first cutout portion 64 and a second cutout portion 65 are formed in the insulating layer 13. The first cutout portion 64 and the second cutout portion 65 are arranged so that only the inner region of the substrate 2 is coated with the insulating layer 13.

The first cutout portion 64 exposes a region excluding an edge closer to the second external electrode 63 of the first pad film 11 as a first pad region 66. The first external electrode 62 is arranged at the first pad region 66 exposed from the first cutout portion 64 so as to be electrically connected to the first pad region 66. The first external electrode 62 is electrically connected to the functional element 9 via the first pad film 11. The first external electrode 62 is formed so as to protrude from the insulating layer 13, and has a coating portion 62b with which the upper-surface of the insulating layer 13 is coated. The first external electrode 62 may be an Ni/Pd/Au laminated film that includes an Ni film, a Pd film, and an Au film laminated in this order from the side of the substrate 2.

The second cutout portion 65 exposes a region excluding an edge closer to the first external electrode 62 of the second pad film 12 as a second pad region 67. The second external electrode 63 is arranged at the second pad region 67 exposed from the second cutout portion 65 so as to be electrically connected to the second pad region 67. The second external electrode 63 is electrically connected to the functional element 9 via the second pad film 12. The second external electrode 63 is formed so as to protrude from the insulating layer 13, and has a coating portion 63b with which the upper-surface of the insulating layer 13 is coated. The second external electrode 63 may be an Ni/Pd/Au laminated film that includes an Ni film, a Pd film, and an Au film laminated in this order from the side of the substrate 2.

One feature of the chip part 61 according to the present preferred embodiment resides in that a first wall-surface insulating film 70 is formed on a wall surface 64a of the first cutout portion 64 and in that a second wall-surface insulating film 71 is formed on a wall surface 65a of the second cutout portion 65. The thus formed configuration makes it possible to excellently form the first external electrode 62 on the first pad film 11 exposed from the first cutout portion 64, and makes it possible to excellently form the first external electrode on the second pad film 12 exposed from the second cutout portion 65.

Figure 11A:
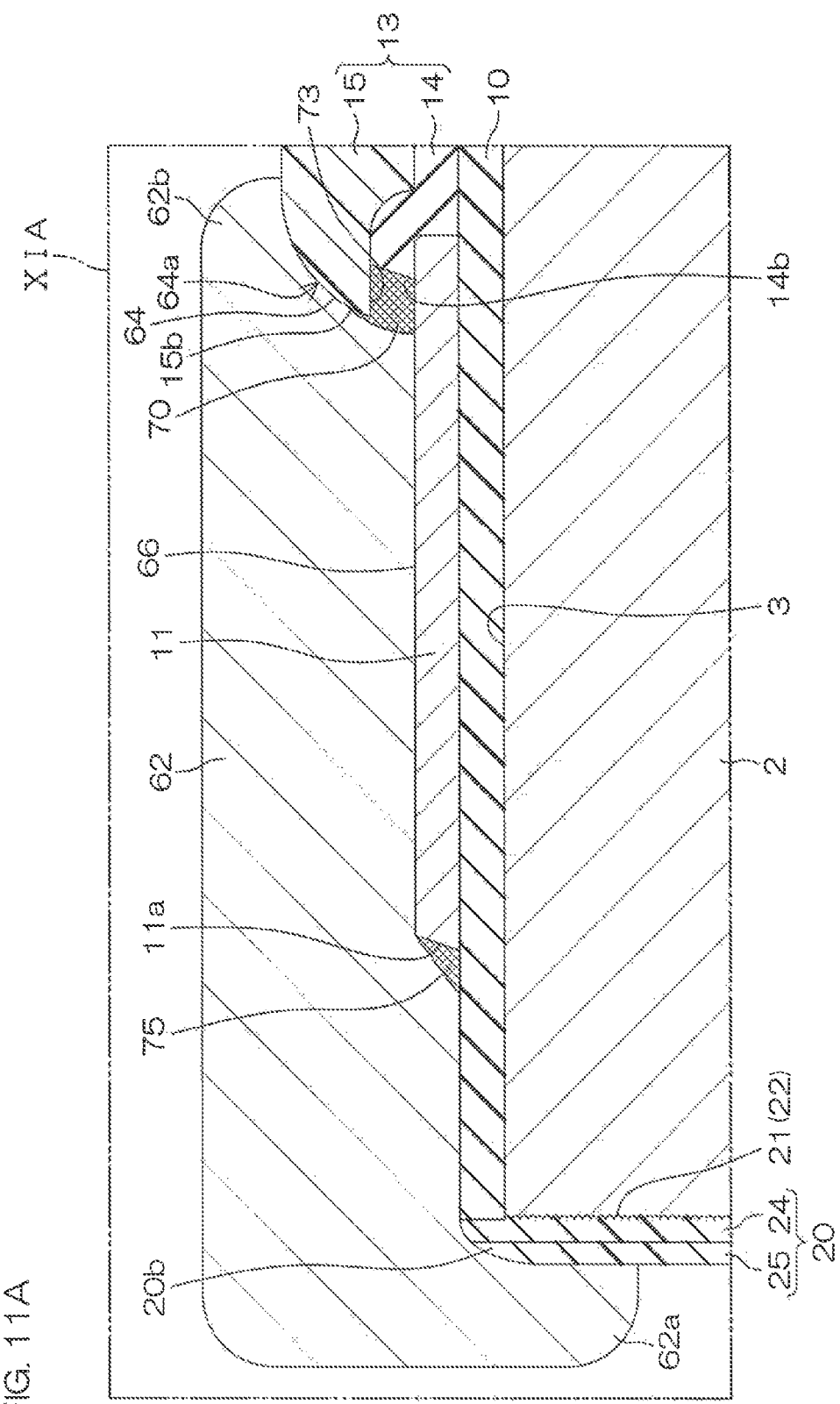
FIG. 11A is an enlarged view of a portion surrounded by broken line XIA shown in FIG. 9.
Figure 11B:
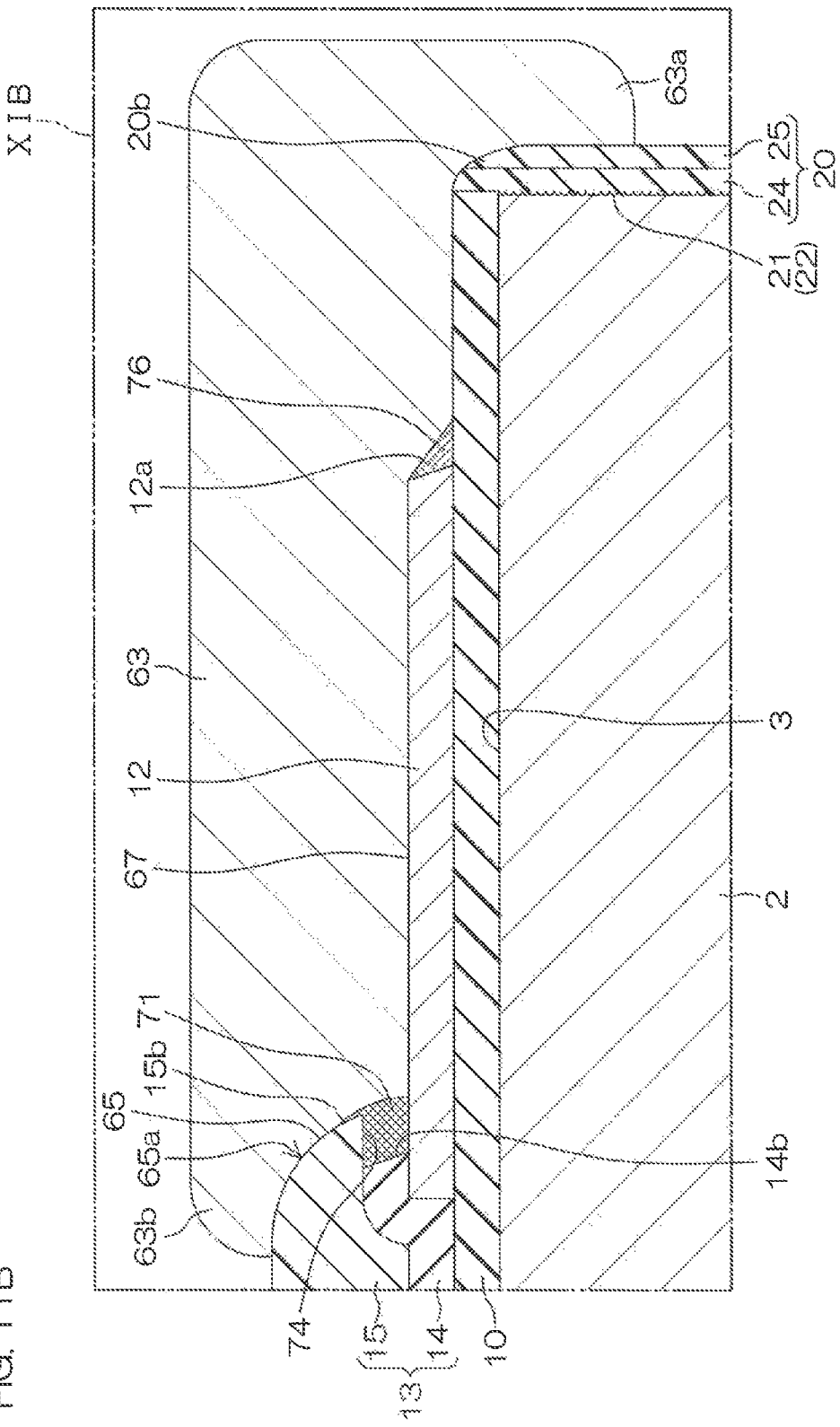
FIG. 11B is an enlarged view of a portion surrounded by broken line XIB shown in FIG. 9.

A detailed description will be hereinafter given of the first wall-surface insulating film 70, the second wall-surface insulating film 71, and a structure therearound with reference to FIG. 11A and FIG. 11B. FIG. 11A is an enlarged view of a portion surrounded by broken line XIA shown in FIG. 9. FIG. 11B is an enlarged view of a portion surrounded by broken line XIB shown in FIG. 9.

As shown in FIG. 11A, the wall surface 64a of the first cutout portion 64 is defined by the inner wall 14b of the passivation film 14 and the inner wall 15b of the resin film 15. The inner wall 15b of the resin film 15 is formed in a curved shape that is rounded toward the outside of the substrate 2. The inner wall 14b of the passivation film 14 is positioned closer to the second external electrode 63 than the inner wall 15b of the resin film 15. Additionally, the inner wall 14b of the passivation film 14 is positioned on the first pad film 11. A hollow 73 is defined by the first pad film 11, the inner wall 14b of the passivation film 14, and the resin film 15 in the wall surface 64a of the first cutout portion 64.

The first wall-surface insulating film 70 includes the same insulating material as the sidewall insulating film 20, and fills the hollow 73 therewith on the first pad film 11. The surface of the first wall-surface insulating film 70 is connected to the wall surface 64a of the first cutout portion 64 without differences in level, and is inclined downwardly from the wall surface 64a of the first cutout portion 64. The surface of the first wall-surface insulating film 70 may be formed in a curved shape that is rounded toward the outside of the first cutout portion 64. Additionally, the first wall-surface insulating film 70 may coat a part of the resin film 15 therewith.

As shown in FIG. 11B, the wall surface 65a of the second cutout portion 65 is defined by the inner wall 14b of the passivation film 14 and the inner wall 15b of the resin film 15. The inner wall 15b of the resin film 15 is formed in a curved shape that is rounded toward the outside of the substrate 2. The inner wall 14b of the passivation film 14 is positioned closer to the first external electrode 62 than the inner wall 15b of the resin film 15. Additionally, the inner wall 14b of the passivation film 14 is positioned on the second pad film 12. A hollow 74 is defined by the second pad film 12, the inner wall 14b of the passivation film 14, and the resin film 15 in the wall surface 65a of the second cutout portion 65.

The second wall-surface insulating film 70 includes the same insulating material as the sidewall insulating film 20, and fills the hollow 74 therewith on the second pad film 12. The surface of the second wall-surface insulating film 70 is connected to the wall surface 65a of the second cutout portion 65 without differences in level, and is inclined downwardly from the wall surface 65a of the second cutout portion 65. The surface of the second wall-surface insulating film 70 may be formed in a curved shape that is rounded toward the outside of the second cutout portion 65. Additionally, the second wall-surface insulating film 70 may coat a part of the resin film 15 therewith.

Additionally, another feature of the chip part 61 according to the present preferred embodiment resides in that a sidewall 11a of the first pad film 11 exposed from the first cutout portion 64 is coated with a first pad-sidewall insulating film 75 and in that a sidewall 12a of the second pad film 12 exposed from the second cutout portion 65 is coated with a second pad-sidewall insulating film 76.

The first pad-sidewall insulating film 75 includes the same insulating material as the sidewall insulating film 20, and coats the sidewall 11a of the first pad film 11 therewith from on the upper-surface insulating film 10. As a result, a difference in level between the upper surface of the upper-surface insulating film 10 and the upper surface of the first pad film 11 is reduced. The first pad-sidewall insulating film 75 may have an extension portion on the upper surface of the first pad film 11.

The second pad-sidewall insulating film 76 includes the same insulating material as the sidewall insulating film 20, and coats the sidewall 12a of the second pad film 12 therewith from on the upper-surface insulating film 10. As a result, a difference in level between the upper surface of the upper-surface insulating film 10 and the upper surface of the second pad film 12 is reduced. The second pad-sidewall insulating film 76 may have an extension portion on the upper surface of the second pad film 12.

A plurality of concavo-convex portions 21 are formed on the sidewall 5 of the substrate 2 according to the present preferred embodiment, and are arranged in the same way as in the first preferred embodiment mentioned above, and therefore a description of these concavo-convex portions 21 is omitted.

As described above, the chip part 61 according to the present preferred embodiment has the first wall-surface insulating film 70 formed so as to be connected to the wall surface 64a of the first cutout portion 64 without differences in level and the second wall-surface insulating film 71 formed so as to be connected to the wall surface 65a of the second cutout portion 65 without differences in level. The first wall-surface insulating film 70 fills the hollow 73 defined by the wall surface 64a of the first cutout portion 64 therewith, and the second wall-surface insulating film 71 fills the hollow 74 defined by the wall surface 65a of the second cutout portion 65 therewith. Additionally, in the chip part 61 according to the present preferred embodiment, the difference in level between the upper surface of the upper-surface insulating film 10 and the upper surface of the first pad film 11 is reduced by the first pad-sidewall insulating film 75, and the difference in level between the upper surface of the upper-surface insulating film 10 and the upper surface of the second pad film 12 is reduced by the second pad-sidewall insulating film 76.

As a result, it is possible to effectively improve the embedability of the first external electrode 62 with respect to the first cutout portion 64 and the embedability of the second external electrode 63 with respect to the second cutout portion 65. As a result, it is possible to excellently and electrically connect the first external electrode 62 and the first pad film 11 together, and it is possible to excellently and electrically connect the second external electrode 63 and the second pad film 12 together.

Additionally, the chip part 61 according to the present preferred embodiment includes the first external electrode 62 formed so as to extend around the sidewall 5 of the substrate 2 and the second external electrode 63 formed so as to extend around the sidewall 5 of the substrate 2. This makes it possible to increase the bonding area of an electroconductive jointing material (for example, a solder) with respect to the first external electrode 62 and with respect to the second external electrode 63, and hence makes it possible to heighten the connection strength of the chip part 61 in a mounted state. Additionally, in the mounted state, it becomes possible to hold the chip part 61 from three directions by the first external electrode 62 and the second external electrode 63 with both of which the three sidewalls 5 of the substrate are coated, and hence becomes possible to further stabilize the mounted shape of the chip part 61.

Although the preferred embodiments of the present invention have been described as above, the present invention can be embodied in still other modes.

For example, in the first preferred embodiment mentioned above, a description has been given to the effect that various elements, such as a resistor or a capacitor, are employed as the functional element 9. For example, if a resistor is formed as the functional element 9, a resistance conductor film 81 electrically connected to the first pad film 11 and to the second pad film 12 is formed between the first pad film 11 and the second pad film 12 as shown in FIG. 12. For example, if it is a conductor film higher in resistivity than copper, this conductor film is appropriate as the resistance conductor film 81. A Ti film or a TiN film can be mentioned as the resistance conductor film 81.

Figure 13:
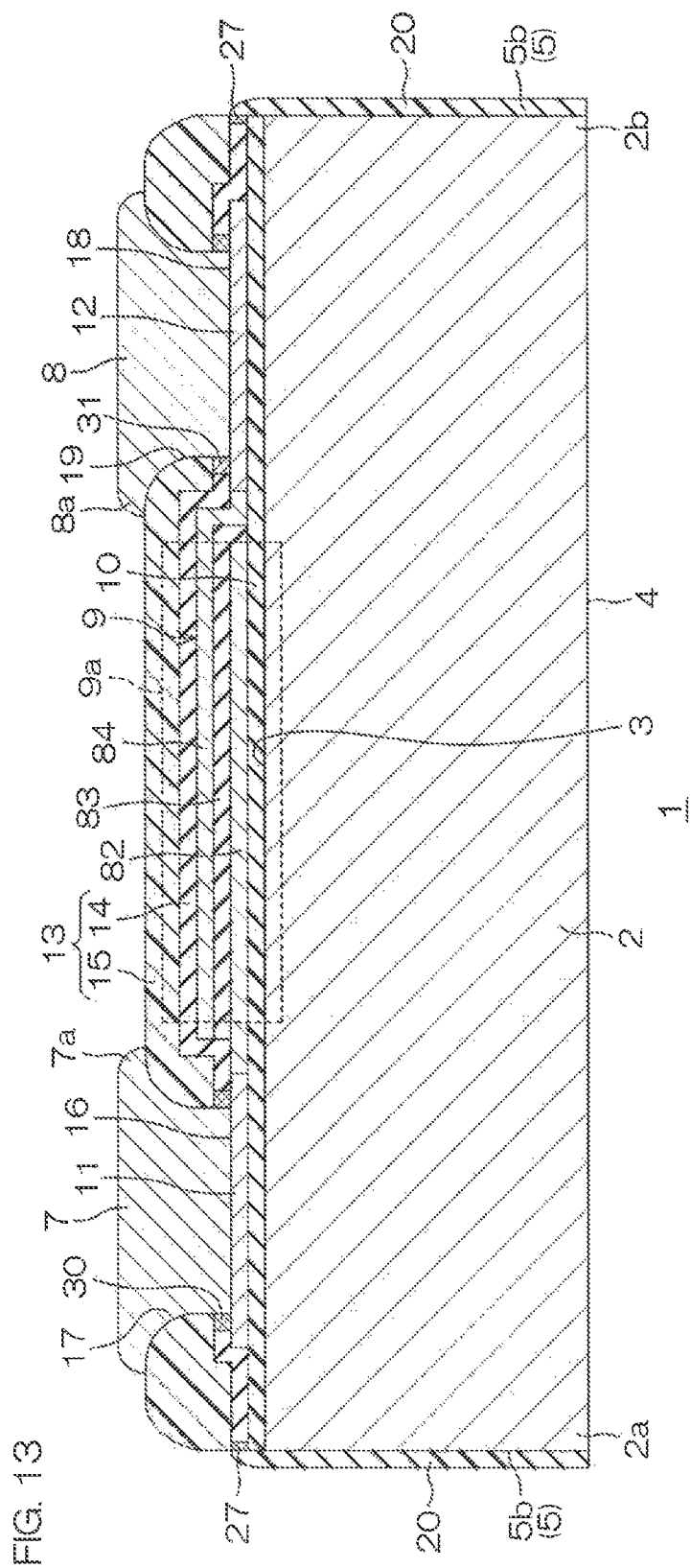
FIG. 13 is a cross-sectional view showing a chip part in which a capacitor is employed as a functional element.

If a capacitor is formed as the functional element 9, it includes a layered structure including a first conductor film 82 arranged on the upper-surface insulating film 10, a dielectric film 83 arranged on the first conductor film 82, and a second conductor film 84 arranged on the dielectric film 83 is formed between the first pad film 11 and the second pad film 12 as shown in FIG. 13. In this arrangement, the first conductor film 82 is formed integrally with the first pad film 11, and the second conductor film 84 is formed integrally with the second pad film 12.

Of course, a coil, a fuse, or the like can be employed as the functional element 9, without being limited to the resistor and the capacitor. If a coil is employed as the functional element 9, a spiral coil conductor film is formed on the substrate 2 so as to be electrically connected to the first pad film 11 and to the second pad film 12. If a fuse is formed as the functional element 9, an electroconductive fusible film that is fused by a predetermined amount of heat (Joule heat) is formed on the substrate 2 so as to be electrically connected to the first pad film 11 and to the second pad film 12.

Additionally, in each preferred embodiment mentioned above, the substrate 2 may be a semiconductor substrate (silicon substrate). If the substrate 2 is a semiconductor substrate, it is also possible to fabricate a diode serving as the functional element 9 in the substrate 2. In this case, for example, the first pad film 11 is used as an anode electrode film electrically connected to an anode of the diode, whereas the second pad film 12 is used as a cathode electrode film electrically connected to a cathode of the diode.

The chip parts 1 and 61 mentioned above can be incorporated into a piece of electronic equipment or into a mobile terminal, such as portable electronic equipment, so as to serve as, for example, a circuit element for a power source circuit, for a high frequency circuit, for a digital circuit, or the like.

Besides, various design changes may be made within the scope of the matters described in the claims.

The present application corresponds to Japanese Patent Application No. 2016-028289 filed in the Japan Patent Office on Feb. 17, 2016, and the entire disclosure of the application is incorporated herein by reference.

Although the preferred embodiments of the present invention have been described in detail as above, these are merely specific examples used to clarify the technical contents of the present invention, and the present invention should not be understood as being limited to these examples, and the scope of the present invention is to be determined solely by the appended claims.

What is claimed is:

1. A chip part comprising:
    a substrate that has an upper surface, a lower surface positioned on an opposite side of the upper surface, and a sidewall by which the upper surface and the lower surface are connected together;
    a functional element formed at the side of the upper surface of the substrate, the functional element having a height that extends above the upper surface of the substrate;
    a first pad film and a second pad film that are arranged at the upper surface of the substrate with an interval between the first pad film and the second pad film so as to be electrically connected to the functional element, the first pad film and the second pad film each having a same height from the upper surface of the substrate as the height of the functional element;
    a first external electrode and a second external electrode that are arranged on the first pad film and the second pad film, respectively, the first external electrode and the second external electrode having respective surfaces each having a curved surface portion with a center of curvature being located under respective top surface portions of the first and second electrodes; and
    a sidewall insulating film with which the sidewall of the substrate is coated wherein the sidewall insulating film has a flat surface.

2. The chip part according to claim 1, further comprising:
    an insulating layer arranged at the upper surface of the substrate, the insulating layer having a first pad opening by which the first pad film is exposed and a second pad opening by which the second pad film is exposed;
    a first inner-wall insulating film formed on an inner wall of the first pad opening; and
    a second inner-wall insulating film formed on an inner wall of the second pad opening;
    wherein the first external electrode is arranged on the first pad film exposed from the first pad opening, and the second external electrode is arranged on the second pad film exposed from the second pad opening.

3. The chip part according to claim 2, wherein a surface of the first inner-wall insulating film is connected to the inner wall of the first pad opening in the first pad opening without a difference in level, and
    a surface of the second inner-wall insulating film is connected to the inner wall of the second pad opening in the second pad opening without a difference in level.

4. The chip part according to claim 2, wherein the insulating layer includes a passivation film and a resin film that are laminated together in this order from a side of the upper surface of the substrate.

5. The chip part according to claim 2, wherein the first inner-wall insulating film includes a same insulating material as the sidewall insulating film, and
    the second inner-wall insulating film includes a same insulating material as the sidewall insulating film.

6. The chip part according to claim 1, further comprising:
    an upper-surface insulating film formed so as to be contiguous to the upper surface of the substrate,
    wherein the sidewall insulating film coats the upper-surface insulating film from a side of the sidewall of the substrate, in addition to the sidewall of the substrate.

7. The chip part according to claim 1, further comprising:
    an insulating layer arranged at the upper surface of the substrate, the insulating layer having a first cutout portion by which the first pad film is exposed and a second cutout portion by which the second pad film is exposed;
a first wall-surface insulating film with which a wall surface of the first cutout portion is coated; and
a second wall-surface insulating film with which a wall surface of the second cutout portion is coated;
wherein the first external electrode is arranged on the first pad film exposed from the first cutout portion, and
the second external electrode is arranged on the second pad film exposed from the second cutout portion.

8. The chip part according to claim 7, wherein the first wall-surface insulating film includes a same insulating material as the sidewall insulating film, and
the second wall-surface insulating film includes a same insulating material as the sidewall insulating film.

9. The chip part according to claim 1, further comprising:
an insulating layer arranged at the upper surface of the substrate, the insulating layer having a first cutout portion by which the first pad film is selectively exposed and a second cutout portion by which the second pad film is selectively exposed;
a first pad-sidewall insulating film with which the sidewall of the first pad film exposed from the first cutout portion is coated; and
a second pad-sidewall insulating film with which the sidewall of the second pad film exposed from the second cutout portion is coated;
wherein the first external electrode is arranged on the first pad film exposed from the first cutout portion, and
the second external electrode is arranged on the second pad film exposed from the second cutout portion.

10. The chip part according to claim 9, wherein the first pad-sidewall insulating film includes a same insulating material as the sidewall insulating film, and
the second pad-sidewall insulating film includes a same insulating material as the sidewall insulating film.

11. The chip part according to claim 1, wherein an upper end portion of the sidewall insulating film that is positioned on a side of the upper surface of the substrate is formed in a curved, rounded shape.

12. The chip part according to claim 1, wherein the respective surfaces of the first external electrode and the second external electrode each have a flat surface portion.

13. The chip part according to claim 1, wherein the first external electrode is spaced by a first predetermined distance from a first side of the substrate adjacent to the first external electrode when viewed in plan, and the second external electrode is spaced by a second predetermined distance from a second side of the substrate adjacent to the second external electrode when viewed in plan.

14. The chip part according to claim 13, wherein the first predetermined distance and the second predetermined distance are equal to each other.

15. The chip part according to claim 13, wherein the first external electrode has a side that is parallel with the first side when viewed in plan, and the second external electrode has a side that is parallel with the second side when viewed in plan.

16. A chip part comprising:
a substrate that has an upper surface, a lower surface positioned on an opposite side of the upper surface, and a sidewall by which the upper surface and the lower surface are connected together, the substrate having a plurality of concavo-convex portions formed on the sidewall from a side of the upper surface toward a side of the lower surface;
a functional element formed at the side of the upper surface of the substrate;
a first external electrode and a second external electrode that are arranged at the upper surface of the substrate so as to be electrically connected to the functional element; and
a sidewall insulating film with which the sidewall of the substrate is coated so as to fill the plurality of concavo-convex portions formed on the sidewall of the substrate,
wherein a first concavo-convex-portion forming region is formed in a region of the sidewall of the substrate on the side of the upper surface of the substrate, and a second concavo-convex-portion forming region is formed in a region of the sidewall of the substrate that is closer to the lower surface of the substrate than the first concavo-convex-portion forming region,
the first concavo-convex-portion forming region includes the plurality of concavo-convex portions having a first pitch, and
the second concavo-convex-portion forming region includes the plurality of concavo-convex portions having a second pitch larger than the first pitch.

17. The chip part according to claim 16, wherein the plurality of concavo-convex portions are formed in streaks extending in parallel along a side line of the substrate.

* * * * *